United States Patent
Sarkis et al.

(10) Patent No.: US 10,615,825 B2
(45) Date of Patent: Apr. 7, 2020

(54) EARLY-TERMINATION TECHNIQUES FOR POLAR LIST DECODERS

(71) Applicant: QUALCOMM Incorporated, San Diego, CA (US)

(72) Inventors: Gabi Sarkis, San Diego, CA (US); Jing Jiang, San Diego, CA (US); Jamie Menjay Lin, San Diego, CA (US); Yang Yang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 148 days.

(21) Appl. No.: 15/969,724

(22) Filed: May 2, 2018

(65) Prior Publication Data

US 2018/0323810 A1    Nov. 8, 2018

Related U.S. Application Data

(60) Provisional application No. 62/502,458, filed on May 5, 2017.

(51) Int. Cl.
*H03M 13/39* (2006.01)
*H03M 13/37* (2006.01)
(Continued)

(52) U.S. Cl.
CPC ....... *H03M 13/3961* (2013.01); *H03M 13/13* (2013.01); *H03M 13/3738* (2013.01);
(Continued)

(58) Field of Classification Search
CPC ............. H03M 13/3961; H03M 13/13; H03M 13/3738; H04L 1/0053; H04L 1/0045;
(Continued)

(56) References Cited

U.S. PATENT DOCUMENTS

| 4,675,871 A * | 6/1987 | Gordon ................ H03M 13/33 |
| | | 714/789 |
| 2005/0066260 A1* | 3/2005 | Natori ............... H03M 13/3738 |
| | | 714/795 |

(Continued)

FOREIGN PATENT DOCUMENTS

JP    2001196943 A    7/2001

OTHER PUBLICATIONS

V. Bioglio, F. Gabry, L. Godard and I. Land, "Two-Step Metric Sorting for Parallel Successive Cancellation List Decoding of Polar Codes," in IEEE Communications Letters, vol. 21, No. 3, pp. 456-459, Mar. 2017. (Year: 2017).*

(Continued)

*Primary Examiner* — Cynthia Britt
(74) *Attorney, Agent, or Firm* — Holland & Hart LLP

(57) ABSTRACT

Methods, systems, and devices for wireless communication are described. In a new radio (NR) system, a wireless device may identify a candidate codeword for a channel employing polar coding. The wireless device may perform a decoding operation on the candidate codeword to determine candidate decoding paths corresponding to encoded information bits. The decoding operation may include multiple decoding path candidates, each of which is associated with a path metric. The wireless device may evaluate a spread metric to determine if a decoding hypothesis is incorrect or if the received codeword is too corrupted for decoding. The spread metric may be based on the path metrics of the decoding paths or soft metrics of the decoding paths determined based on a subset of bit channels of the polar code. The wireless device may normalize the spread metric to compensate for signal-to-noise ratio (SNR) variation.

46 Claims, 9 Drawing Sheets

(51) Int. Cl.
*H04L 1/00* (2006.01)
*H03M 13/13* (2006.01)
*H04W 72/04* (2009.01)

(52) U.S. Cl.
CPC .......... *H04L 1/0045* (2013.01); *H04L 1/0053* (2013.01); *H04L 1/0057* (2013.01); *H04W 72/0406* (2013.01); *H04W 72/0466* (2013.01)

(58) Field of Classification Search
CPC ............ H04L 1/0057; H04W 72/0406; H04W 72/0466
See application file for complete search history.

(56) References Cited

U.S. PATENT DOCUMENTS

| | | | |
|---|---|---|---|
| 2010/0172396 A1* | 7/2010 | Cairns | H04B 1/7113 375/148 |
| 2014/0016677 A1* | 1/2014 | Dua | H04L 25/0216 375/148 |
| 2017/0033807 A1 | 2/2017 | Kim et al. | |
| 2017/0223653 A1* | 8/2017 | Weitnauer | H04W 56/0045 |
| 2017/0238255 A1* | 8/2017 | Chari | H04L 1/0051 455/574 |
| 2019/0007068 A1* | 1/2019 | Arditti Ilitzky | H03M 13/2993 |

OTHER PUBLICATIONS

F. Ercan, C. Condo, S. A. Hashemi and W. J. Gross, "On error-correction performance and implementation of polar code list decoders for 5G," 2017 55th Annual Allerton Conference on Communication, Control, and Computing (Allerton), Monticello, IL, 2017, pp. 443-449. (Year: 2017).*

X. Liang, J. Yang, C. Zhang, W. Song and X. You, "Hardware Efficient and Low-Latency CA-SCL Decoder Based on Distributed Sorting," 2016 IEEE Global Communications Conference (GLOBECOM), Washington, DC, 2016, pp. 1-6. (Year: 2016).*

L. L Chandesris, V. Savin and D. Declercq, "An Improved SCFlip Decoder for Polar Codes," 2016 IEEE Global Communications Conference (GLOBECOM), Washington, DC, 2016, pp. 1-6. (Year: 2016).*

International Search Report and Written Opinion—PCT/US2018/030917—ISA/EPO—Sep. 7, 2018.

Mediatek Inc: "Comparison of Coding Candidates for eMBB Data Channel of Short Codeblock Length", 3GPP Draft; R1-1613343_Comparison of Coding Candidates for eMBB Data Channel of Short Codeblock Length_Rev_Final, 3rd Generation Partnership Project (3GPP), Mobile Competence Centre, 650, Route Des Lucioles, F-06921 Sophia-Antipolis Cedex, France, vol. RAN WG1, No. Reno, USA; Nov. 14, 2016-Nov. 18, 2016 Nov. 19, 2016, XP051191207, Retrieved from the Internet: URL:http://www.3gpp.org/ftp/tsg_ran/WG1_RL1/TSGR1_87/Docs/ [retrieved on Nov. 19, 2016], 11 pages.

Qualcomm Incorporated: "Evaluation of Early Termination for Polar Codes", 3GPP Draft; R1-1711215 Evaluation of Early Termination for Polar Codes, 3rd Generation Partnership Project (3GPP), Mobile Competence Centre, 650, Route Des Lucioles, F-06921 Sophia-Antipolis Cedex, France, vol. RAN WG1, No. Qingdao; Jun. 27, 2017-Jun. 30, 2017 Jun. 20, 2017, XP051305802, Retrieved from the Internet: URL:http://www.3gpp.org/ftp/tsg_ran/WG1_RL1/TSGR1_AH/NR_AH_1706/Docs/ [retrieved on-Jun. 20, 2017], 16 pages.

Zhou H., et al., "Segmented CRC-Aided SC List Polar Decoding", 2016 IEEE 83rd Vehicular Technology Conference, May 15, 2016, XP032918751, pp. 1-5, DOI: 10.1109/VTCSPRING.2016.7504469, [retrieved on Jul. 5, 2016].

* cited by examiner

EARLY-TERMINATION TECHNIQUES FOR POLAR LIST DECODERS

CROSS REFERENCES

The present Application for patent claims priority to U.S. Provisional Patent Application No. 62/502,458 by Sarkis, et al., entitled "Early-Termination Techniques For Polar List Decoders," filed May 5, 2017, which is assigned to the assignee hereof and expressly incorporated by reference herein.

BACKGROUND

The following relates generally to wireless communication, and more specifically to early-termination techniques for polar list decoders.

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include code division multiple access (CDMA) systems, time division multiple access (TDMA) systems, frequency division multiple access (FDMA) systems, and orthogonal frequency division multiple access (OFDMA) systems, (e.g., a Long Term Evolution (LTE) system, or a New Radio (NR) system). A wireless multiple-access communications system may include a number of base stations or access network nodes, each simultaneously supporting communication for multiple communication devices, which may be otherwise known as user equipment (UE).

Wireless communications, however, often involve sending data over a noisy communication channel. To combat noise, a transmitter may encode data in the form of code blocks using error correcting codes to introduce redundancy in the code block so that transmission errors may be detected and/or corrected. Some examples of encoding algorithms with error correcting codes include convolutional codes (CCs), low-density parity-check (LDPC) codes, and polar codes. A polar code is an example of a linear block error correcting code and has been shown to approach the theoretical channel capacity as the code length approaches infinity. For decoding a polar code, a receiving device may make a candidate hypothesis of the code length and number of information bits, generate a representation of the information bits using a successive cancellation (SC) or successive cancellation list (SCL) decoding process on a candidate codeword according to the candidate hypothesis, and perform an error checking operation on the representation of the information bits to determine if decoding was successful. In some cases, the decoding operation may fail because the codeword has experienced excessive corruption (e.g., the channel has very low signal-to-noise ratio (SNR)), there is no transmitted codeword for the candidate hypothesis (e.g., the candidate codeword represents random noise), the transmitted codeword is intended for a different device, or the candidate hypothesis may be incorrect (e.g., incorrect codeword size, incorrect information bit size, incorrect aggregation level). In some or all of these circumstances, terminating decoding for a candidate hypothesis early (e.g., prior to completion of all decoding processes) may limit power consumption in situations for which the decoding will be unsuccessful. However, differentiating circumstances in which early termination is appropriate (e.g., without terminating decoding early for some decoding processes that could have been successful) provides challenges for existing implementations. Other known techniques for facilitating early termination increase decoding complexity, decreasing the benefits provided by early termination.

SUMMARY

The described techniques relate to improved methods, systems, devices, or apparatuses that support early-termination techniques for polar list decoders. Generally, the described techniques provide for a wireless device to determine whether to terminate a decoding process based on a spread metric associated with a set of decoding path candidates. The wireless device may receive a candidate codeword, and may decode the codeword using a decoding process. The codeword may include multiple bit channels, some of which may contain information bits. The decoding process may be a sequential decoding process that decodes the codeword sequentially by bit channel index. In some cases, the sequential decoding process may use list decoding, where multiple sequential decoding path candidates may be maintained, each assigning different decoded bits to the bit channels. The wireless device may determine a set of path metrics for the decoding path candidates as the wireless device decodes the codeword. The wireless device may determine the spread metric based on at least two path metrics of the set of path metrics, and may compare the spread metric to a spread metric threshold. Based on this comparison, the wireless device may terminate the decoding process prior to completion of the sequential list decoding process, prior to a cyclic redundancy check (CRC), or following both the sequential list decoding process and the CRC.

A method of wireless communication is described. The method may include receiving a candidate codeword encoded using a polar code, the candidate codeword generated based at least in part on a plurality of information bits, performing a decoding process on the candidate codeword, the decoding process comprising, for each bit channel of at least a first subset of bit channels of the polar code, determining path metrics for each of a plurality of decoding paths, determining a spread metric based at least in part on a first path metric corresponding to a first decoding path of the plurality of decoding paths and a second path metric corresponding to a second decoding path of the plurality of decoding paths, and terminating the decoding process based at least in part on a comparison of the spread metric to a spread metric threshold.

An apparatus for wireless communication is described. The apparatus may include means for receiving a candidate codeword encoded using a polar code, the candidate codeword generated based at least in part on a plurality of information bits, means for performing a decoding process on the candidate codeword, the decoding process comprising, for each bit channel of at least a first subset of bit channels of the polar code, means for determining path metrics for each of a plurality of decoding paths, means for determining a spread metric based at least in part on a first path metric corresponding to a first decoding path of the plurality of decoding paths and a second path metric corresponding to a second decoding path of the plurality of decoding paths, and means for terminating the decoding process based at least in part on a comparison of the spread metric to a spread metric threshold.

Another apparatus for wireless communication is described. The apparatus may include a processor, memory in electronic communication with the processor, and instructions stored in the memory. The instructions may be operable to cause the processor to receive a candidate codeword encoded using a polar code, the candidate codeword generated based at least in part on a plurality of information bits, perform a decoding process on the candidate codeword, the decoding process comprising, for each bit channel of at least a first subset of bit channels of the polar code, determine path metrics for each of a plurality of decoding paths, determine a spread metric based at least in part on a first path metric corresponding to a first decoding path of the plurality of decoding paths and a second path metric corresponding to a second decoding path of the plurality of decoding paths, and terminate the decoding process based at least in part on a comparison of the spread metric to a spread metric threshold.

A non-transitory computer readable medium for wireless communication is described. The non-transitory computer-readable medium may include instructions operable to cause a processor to receive a candidate codeword encoded using a polar code, the candidate codeword generated based at least in part on a plurality of information bits, perform a decoding process on the candidate codeword, the decoding process comprising, for each bit channel of at least a first subset of bit channels of the polar code, determine path metrics for each of a plurality of decoding paths, determine a spread metric based at least in part on a first path metric corresponding to a first decoding path of the plurality of decoding paths and a second path metric corresponding to a second decoding path of the plurality of decoding paths, and terminate the decoding process based at least in part on a comparison of the spread metric to a spread metric threshold.

In some examples of the method, apparatus, and non-transitory computer-readable medium described above, the decoding process may be terminated prior to completion of a list decoding process for each bit channel of the first subset of bit channels. In some examples of the method, apparatus, and non-transitory computer-readable medium described above, the decoding process may be terminated prior to completion of a CRC procedure. In some examples of the method, apparatus, and non-transitory computer-readable medium described above, the decoding process may be terminated following completion of both a list decoding process for each bit channel of the first subset of bit channels and a CRC procedure.

In some examples of the method, apparatus, and non-transitory computer-readable medium described above, the first path metric corresponds to a maximum path metric or a minimum path metric of a set of path metrics associated with the plurality of decoding paths. In some examples of the method, apparatus, and non-transitory computer-readable medium described above, the second path metric corresponds to the other of the maximum path metric or the minimum path metric of the set of path metrics.

In some examples of the method, apparatus, and non-transitory computer-readable medium described above, the at least the first subset of bit channels of the polar code comprise bit channels subsequent to at least one bit channel corresponding to at least one of the plurality of information bits.

In some examples of the method, apparatus, and non-transitory computer-readable medium described above, the path metrics for the plurality of decoding paths may be based on bit metrics for the each bit channel for the plurality of decoding paths and for a second subset of bit channels of the polar code preceding the each bit channel for the plurality of decoding paths.

Some examples of the method, apparatus, and non-transitory computer-readable medium described above may further include processes, features, means, or instructions for selecting, according to a decoding order, the second subset of bit channels of the polar code preceding the each bit channel based at least in part on at least one of generator weights associated with bit channels of the polar code, polarization weights associated with bit channels of the polar code, reliability metrics associated with bit channels of the polar code, or a combination thereof.

In some examples of the method, apparatus, and non-transitory computer-readable medium described above, the second subset of bit channels of the polar code preceding the each bit channel comprises at least one information bit channel associated with one of the plurality of information bits and at least one frozen bit channel.

In some examples of the method, apparatus, and non-transitory computer-readable medium described above, the spread metric may be determined based at least in part on a function of a maximum path metric of a set of path metrics associated with the plurality of decoding paths, a minimum path metric of the set of path metrics or an average path metric of the set of path metrics.

In some examples of the method, apparatus, and non-transitory computer-readable medium described above, the spread metric may be determined based at least in part on a standard deviation of a set of path metrics associated with the plurality of decoding paths, a variance of the set of path metrics, or any combination thereof.

In some examples of the method, apparatus, and non-transitory computer-readable medium described above, determining the spread metric comprises: comparing the first path metric to the second path metric and normalizing the comparison with respect to one of the first path metric or the second path metric.

In some examples of the method, apparatus, and non-transitory computer-readable medium described above, the termination of the decoding process may be based at least in part on the spread metric being below the spread metric threshold.

In some examples of the method, apparatus, and non-transitory computer-readable medium described above, the spread metric threshold may be selected based at least in part on one or both of an early-termination probability associated with the candidate codeword and an error-correction performance associated with the candidate codeword.

In some examples of the method, apparatus, and non-transitory computer-readable medium described above, the candidate codeword may be received via a physical downlink control channel (PDCCH) or a physical uplink control channel (PUCCH).

DETAILED DESCRIPTION

Figure 1:
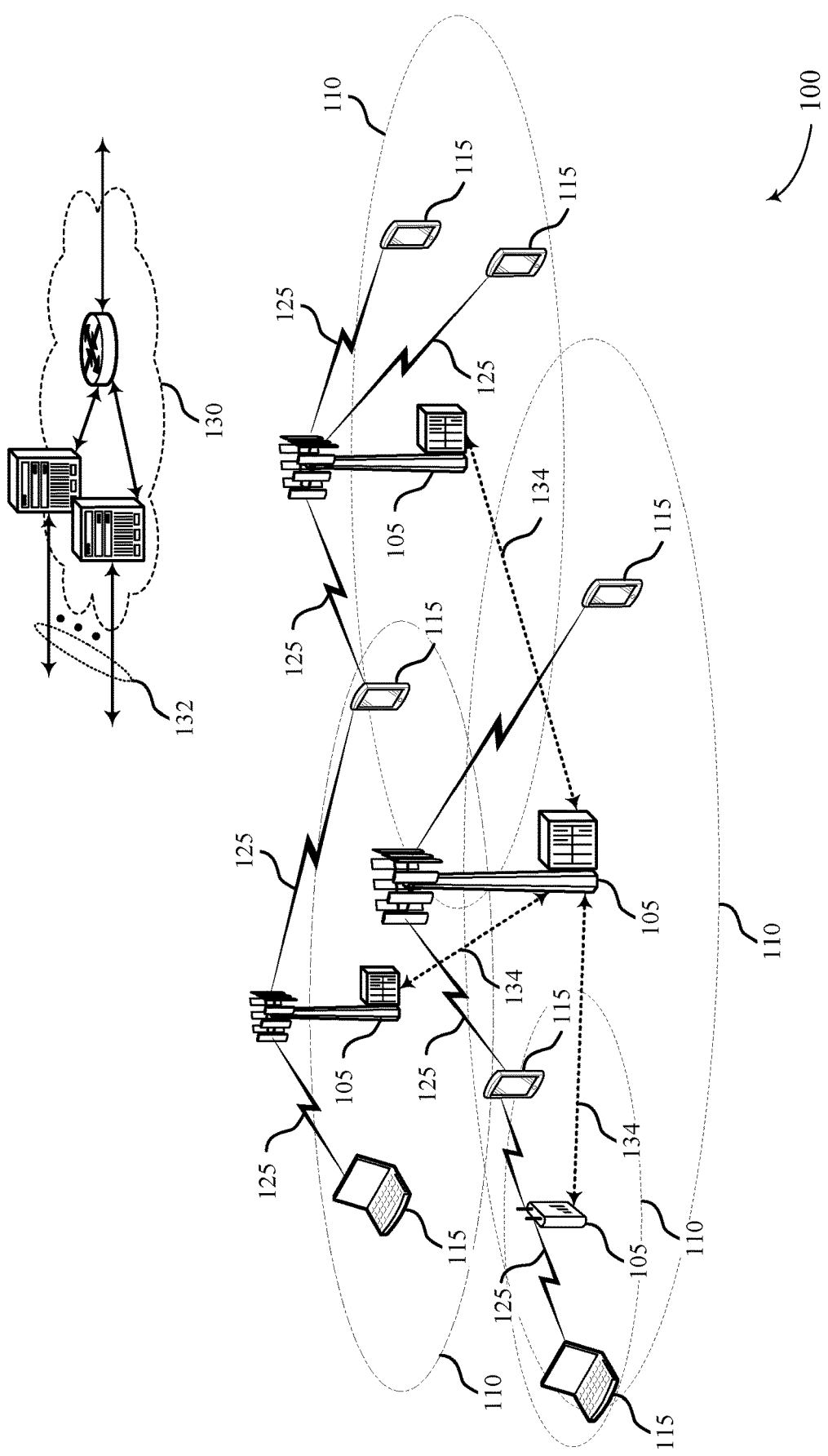
FIG. 1 illustrates an example of a system for wireless communication that supports early-termination techniques for polar list decoders in accordance with aspects of the present disclosure.

In some wireless systems, such as new radio (NR) systems, a wireless device may receive a candidate codeword over a control channel. The wireless device may perform a blind list decoding operation on the candidate codeword based on a decoding hypothesis. In some cases, the wireless device may successfully decode a codeword with the blind list decoding operation. However, in other cases, the blind list decoding operation may fail. For example, the candidate codeword may represent random noise on the channel or a corrupted codeword. In other examples, the wireless device may perform decoding using incorrect decoding hypotheses (e.g., incorrect codeword size, incorrect information bit size, incorrect aggregation level, etc.).

The wireless device may decode the codeword sequentially, starting with a first bit channel and ending with a last bit channel. In some cases, Successive Cancellation List (SCL) decoding may be used for decoding the codeword. In SCL decoding, a decoder may determine candidate paths through a code tree of sub-channels of a code and keep a list size L number of paths through the code tree at each decoding level. A candidate path may also be referred to herein as a decoding path.

In an example, during decoding, a candidate path may be extended at each sub-channel (e.g., each information bit sub-channel) of a code tree through hard decision values of '0' or '1.' Extending L candidate paths by one additional bit results in 2L possible paths. In SCL decoding, a decoder may calculate a path metric for each candidate path and select L paths of the 2L possible paths having the best path metrics. A path metric may be a sum of costs for transitioning from bit value to bit value along a candidate path. Adding a bit having a particular value to a candidate path may be associated with a cost representing the probability of the bit value being correct.

According to some aspects, a wireless device may calculate a spread of path metrics across multiple decoding paths to identify conditions that indicate decoding is unlikely to be successful. Based on the spread of the path metrics, the wireless device may identify whether the wireless device should terminate the decode process early based on this calculation. The wireless device may calculate a spread metric based on a range or spread of the path metrics, and may compare this calculated spread metric to a spread metric threshold. In some cases, the spread metric threshold may be based on an early-termination probability associated with the codeword, an error-correction performance (e.g., based on a block length-code rate combination), or some combination of these parameters. Additionally, in some cases, determining the spread metric or spread metric threshold may dynamically change with channel conditions. For example, the signal to noise ratio (SNR) of the channel may affect the calculated path metrics and, in turn, the spread metric. The wireless device may normalize the spread of the path metrics in order to calculate a spread metric that does not depend on the SNR of the channel. Multiple equations and parameters may be used to calculate this spread metric, as discussed in more detail below.

The wireless device may terminate the decoding process early (e.g., before finishing SCL decoding for each of the bit channels, before performing a cyclic redundancy check (CRC), or after completing both of these processes) based on the comparison of the spread metric to the spread metric threshold. For example, a spread metric value below the spread metric threshold may indicate to the wireless device to perform early-termination. Early-termination may save the wireless device processing overhead, improve decoding latency, and improve false alarm reliability.

Aspects of the disclosure are initially described in the context of a wireless communications system. Aspects are then described with respect to a wireless device, a decoding tree, and a process flow. Aspects of the disclosure are further illustrated by and described with reference to apparatus diagrams, system diagrams, and flowcharts that relate to early-termination techniques for polar list decoders.

FIG. 1 illustrates an example of a wireless communications system 100 in accordance with various aspects of the present disclosure. The wireless communications system 100 includes base stations 105, user equipment (UEs) 115, and a core network 130. In some examples, the wireless communications system 100 may be a Long Term Evolution (LTE), LTE-Advanced (LTE-A) network, LTE-Advanced Pro network, or a NR network. In some cases, wireless communications system 100 may support enhanced broadband communications, ultra-reliable (i.e., mission critical) communications, low latency communications, and communications with low-cost and low-complexity devices. A base station 105 or UE 115 may receive signals over a control channel, and may decode the signals using a list decoder. In some cases, the base station 105 or UE 115 may determine to terminate the decoding process based on a spread metric associated with a set of decoding path candidates for the list decoder (e.g., if the spread metric indicates that the received signals are not associated with a polar coded codeword).

Base stations 105 may wirelessly communicate with UEs 115 via one or more base station antennas. Each base station 105 may provide communication coverage for a respective geographic coverage area 110. Communication links 125 shown in wireless communications system 100 may include uplink transmissions from a UE 115 to a base station 105, or downlink transmissions, from a base station 105 to a UE 115. Control information and data may be multiplexed on an uplink channel or downlink according to various techniques. Control information and data may be multiplexed on a downlink channel, for example, using time division multiplexing (TDM) techniques, frequency division multiplexing (FDM) techniques, or hybrid TDM-FDM techniques. In some examples, the control information transmitted during a transmission time interval (TTI) of a downlink channel may be distributed between different control regions in a cascaded manner (e.g., between a common control region and one or more UE-specific control regions).

UEs 115 may be dispersed throughout the wireless communications system 100, and each UE 115 may be stationary or mobile. A UE 115 may also be referred to as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology. A UE 115 may also be a cellular phone, a personal digital assistant (PDA), a wireless modem, a wireless communication device, a handheld device, a tablet computer, a laptop computer, a cordless phone, a personal electronic device, a handheld device, a personal computer, a wireless local loop (WLL) station, an Internet of Things (IoT) device, an Internet of Everything (IoE) device, a machine type communication (MTC) device, an appliance, an automobile, or the like.

In some cases, a UE 115 may also be able to communicate directly with other UEs (e.g., using a peer-to-peer (P2P) or device-to-device (D2D) protocol). One or more of a group of UEs 115 utilizing D2D communications may be within the geographic coverage area 110 of a cell. Other UEs 115 in such a group may be outside the geographic coverage area 110 of a cell, or otherwise unable to receive transmissions from a base station 105. In some cases, groups of UEs 115 communicating via D2D communications may utilize a one-to-many (1:M) system in which each UE 115 transmits to every other UE 115 in the group. In some cases, a base station 105 facilitates the scheduling of resources for D2D communications. In other cases, D2D communications are carried out independent of a base station 105.

Some UEs 115, such as MTC or IoT devices, may be low cost or low complexity devices, and may provide for automated communication between machines, i.e., Machine-to-Machine (M2M) communication. M2M or MTC may refer to data communication technologies that allow devices to communicate with one another or a base station without human intervention. For example, M2M or MTC may refer to communications from devices that integrate sensors or meters to measure or capture information and relay that information to a central server or application program that can make use of the information or present the information to humans interacting with the program or application. Some UEs 115 may be designed to collect information or enable automated behavior of machines. Examples of applications for MTC devices include smart metering, inventory monitoring, water level monitoring, equipment monitoring, healthcare monitoring, wildlife monitoring, weather and geological event monitoring, fleet management and tracking, remote security sensing, physical access control, and transaction-based business charging.

In some cases, an MTC device may operate using half-duplex (one-way) communications at a reduced peak rate. MTC devices may also be configured to enter a power saving "deep sleep" mode when not engaging in active communications. In some cases, MTC or IoT devices may be designed to support mission critical functions and wireless communications system may be configured to provide ultra-reliable communications for these functions.

Base stations 105 may communicate with the core network 130 and with one another. For example, base stations 105 may interface with the core network 130 through backhaul links 132 (e.g., S1, etc.). Base stations 105 may communicate with one another over backhaul links 134 (e.g., X2, etc.) either directly or indirectly (e.g., through core network 130). Base stations 105 may perform radio configuration and scheduling for communication with UEs 115, or may operate under the control of a base station controller (not shown). In some examples, base stations 105 may be macro cells, small cells, hot spots, or the like. Base stations 105 may also be referred to as evolved NodeBs (eNBs) 105.

A base station 105 may be connected by an S1 interface to the core network 130. The core network may be an evolved packet core (EPC), which may include at least one mobility management entity (MME), at least one serving gateway (S-GW), and at least one Packet Data Network (PDN) gateway (P-GW). The MME may be the control node that processes the signaling between the UE 115 and the EPC. All user Internet Protocol (IP) packets may be transferred through the S-GW, which itself may be connected to the P-GW. The P-GW may provide IP address allocation as well as other functions. The P-GW may be connected to the network operators IP services. The operators IP services may include the Internet, the Intranet, an IP Multimedia Subsystem (IMS), and a Packet-Switched (PS) Streaming Service.

The core network 130 may provide user authentication, access authorization, tracking, IP connectivity, and other access, routing, or mobility functions. At least some of the network devices, such as base station 105 may include subcomponents such as an access network entity, which may be an example of an access node controller (ANC). Each access network entity may communicate with a number of UEs 115 through a number of other access network transmission entities, each of which may be an example of a smart radio head, or a transmission/reception point (TRP). In some configurations, various functions of each access network entity or base station 105 may be distributed across various network devices (e.g., radio heads and access network controllers) or consolidated into a single network device (e.g., a base station 105).

Wireless communications system 100 may operate in an ultra-high frequency (UHF) frequency region using frequency bands from 700 MHz to 2600 MHz (2.6 GHz), although some networks (e.g., a wireless local area network (WLAN)) may use frequencies as high as 4 GHz. This region may also be known as the decimeter band, since the wavelengths range from approximately one decimeter to one meter in length. UHF waves may propagate mainly by line of sight, and may be blocked by buildings and environmental features. However, the waves may penetrate walls sufficiently to provide service to UEs 115 located indoors. Transmission of UHF waves is characterized by smaller antennas and shorter range (e.g., less than 100 km) compared to transmission using the smaller frequencies (and longer waves) of the high frequency (HF) or very high frequency (VHF) portion of the spectrum. In some cases, wireless communications system 100 may also utilize extremely high frequency (EHF) portions of the spectrum (e.g., from 30 GHz to 300 GHz). This region may also be known as the millimeter band, since the wavelengths range from approximately one millimeter to one centimeter in length. Thus, EHF antennas may be even smaller and more closely spaced than UHF antennas. In some cases, this may facilitate use of antenna arrays within a UE 115 (e.g., for directional beamforming). However, EHF transmissions may be subject to even greater atmospheric attenuation and shorter range than UHF transmissions.

Thus, wireless communications system 100 may support millimeter wave (mmW) communications between UEs 115 and base stations 105. Devices operating in mmW or EHF bands may have multiple antennas to allow beamforming. That is, a base station 105 may use multiple antennas or antenna arrays to conduct beamforming operations for directional communications with a UE 115. Beamforming (which may also be referred to as spatial filtering or directional transmission) is a signal processing technique that may be used at a transmitter (e.g., a base station 105) to shape and/or steer an overall antenna beam in the direction of a target receiver (e.g., a UE 115). This may be achieved by combining elements in an antenna array in such a way that transmitted signals at particular angles experience constructive interference while others experience destructive interference.

Multiple-input multiple-output (MIMO) wireless systems use a transmission scheme between a transmitter (e.g., a base station 105) and a receiver (e.g., a UE 115), where both transmitter and receiver are equipped with multiple antennas. Some portions of wireless communications system 100 may use beamforming. For example, base station 105 may have an antenna array with a number of rows and columns of antenna ports that the base station 105 may use for beamforming in its communication with UE 115. Signals may be transmitted multiple times in different directions (e.g., each transmission may be beamformed differently). A mmW receiver (e.g., a UE 115) may try multiple beams (e.g., antenna subarrays) while receiving the synchronization signals.

In some cases, the antennas of a base station 105 or UE 115 may be located within one or more antenna arrays, which may support beamforming or MIMO operation. One or more base station antennas or antenna arrays may be collocated at an antenna assembly, such as an antenna tower. In some cases, antennas or antenna arrays associated with a base station 105 may be located in diverse geographic locations. A base station 105 may multiple use antennas or antenna arrays to conduct beamforming operations for directional communications with a UE 115.

In some cases, wireless communications system 100 may be a packet-based network that operate according to a layered protocol stack. In the user plane, communications at the bearer or Packet Data Convergence Protocol (PDCP) layer may be IP-based. A Radio Link Control (RLC) layer may in some cases perform packet segmentation and reassembly to communicate over logical channels. A Medium Access Control (MAC) layer may perform priority handling and multiplexing of logical channels into transport channels. The MAC layer may also use Hybrid ARQ (HARD) to provide retransmission at the MAC layer to improve link efficiency. In the control plane, the Radio Resource Control (RRC) protocol layer may provide establishment, configuration, and maintenance of an RRC connection between a UE 115 and a network device such as a base station 105, or core network 130 supporting radio bearers for user plane data. At the Physical (PHY) layer, transport channels may be mapped to physical channels.

In some cases, wireless communications system 100 may utilize enhanced component carriers (eCCs). An eCC may be characterized by one or more features including: wider bandwidth, shorter symbol duration, shorter TTIs, and modified control channel configuration. In some cases, an eCC may be associated with a carrier aggregation configuration or a dual connectivity configuration (e.g., when multiple serving cells have a suboptimal or non-ideal backhaul link). An eCC may also be configured for use in unlicensed spectrum or shared spectrum (where more than one operator is allowed to use the spectrum). An eCC characterized by wide bandwidth may include one or more segments that may be utilized by UEs 115 that are not capable of monitoring the whole bandwidth or prefer to use a limited bandwidth (e.g., to conserve power).

In some cases, an eCC may utilize a different symbol duration than other component carriers (CCs), which may include use of a reduced symbol duration as compared with symbol durations of the other CCs. A shorter symbol duration is associated with increased subcarrier spacing. A device, such as a UE 115 or base station 105, utilizing eCCs may transmit wideband signals (e.g., 20, 40, 60, 80 MHz, etc.) at reduced symbol durations (e.g., 16.67 microseconds). A TTI in eCC may consist of one or multiple symbols. In some cases, the TTI duration (that is, the number of symbols in a TTI) may be variable.

A shared radio frequency spectrum band may be utilized in an NR shared spectrum system. For example, an NR shared spectrum may utilize any combination of licensed, shared, and unlicensed spectrums, among others. The flexibility of eCC symbol duration and subcarrier spacing may allow for the use of eCC across multiple spectrums. In some examples, NR shared spectrum may increase spectrum utilization and spectral efficiency, specifically through dynamic vertical (e.g., across frequency) and horizontal (e.g., across time) sharing of resources.

In some cases, wireless communications system 100 may utilize both licensed and unlicensed radio frequency spectrum bands. For example, wireless communications system 100 may employ LTE License Assisted Access (LTE-LAA) or LTE Unlicensed (LTE-U) radio access technology or NR technology in an unlicensed band such as the 5 Ghz Industrial, Scientific, and Medical (ISM) band. When operating in unlicensed radio frequency spectrum bands, wireless devices such as base stations 105 and UEs 115 may employ listen-before-talk (LBT) procedures to ensure the channel is clear before transmitting data. In some cases, operations in unlicensed bands may be based on a carrier aggregation (CA) configuration in conjunction with CCs operating in a licensed band. Operations in unlicensed spectrum may include downlink transmissions, uplink transmissions, or both. Duplexing in unlicensed spectrum may be based on frequency division duplexing (FDD), time division duplexing (TDD) or a combination of both.

In some cases, a base station 105 or UE 115 may encode information into a codeword using a polar code. The base station 105 or UE 115 may transmit the codeword in a control channel, such as the physical downlink control channel (PDCCH) or physical uplink control channel (PUCCH). In order for a wireless device, such as a different base station 105 or UE 115, to receive and decode the codeword, the wireless device may perform blind decoding on the control channel. If the control channel includes a codeword intended for the wireless device, the wireless device may decode the codeword using a list decoder and determine the encoded information. However, if the control channel does not include a codeword intended for the wireless device, the wireless device may terminate the decoding process and conserve power. In some cases, throughout the decoding process, the wireless device may track metrics based on the reliability of each possible decoding path. For example, the wireless device may track path metrics or soft metrics for each of the decoding paths. If many decoding paths have similar reliabilities (e.g., a normalized spread of the path metrics or reliability metrics is very low), the wireless device may determine that it is decoding pure noise, and may terminate the decoding process.

Figure 2:
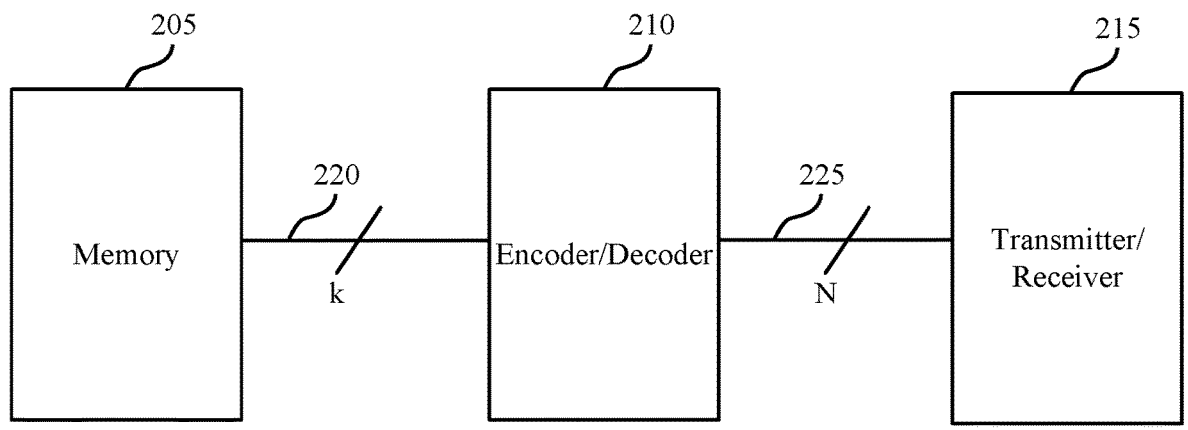
FIG. 2 illustrates an example of a device that supports early-termination techniques for polar list decoders in accordance with aspects of the present disclosure.

FIG. 2 illustrates an example of a device 200 that supports early-termination techniques for polar list decoders in accordance with various aspects of the present disclosure. The device 200 may be any device within a wireless communications system 100 that performs an encoding or decoding process (e.g., using an error-correcting code). In the case of PDCCH or PUCCH signals in an NR system, the error-correcting code may be a polar code. Device 200 may be an example of a UE 115 or a base station 105 as described with reference to FIG. 1.

As shown, device 200 includes a memory 205, an encoder/decoder 210, and a transmitter/receiver 215. First bus 220 may connect memory 205 to encoder/decoder 210 and second bus 225 may connect encoder/decoder 210 to transmitter/receiver 215. In some instances, device 200 may have data stored in memory 205 to be transmitted to another device, such as a UE 115 or base station 105. To initiate the transmission process, device 200 may retrieve from memory 205 the data for transmission. The data may include a number of information bits, which may be is or Os, provided from memory 205 to encoder/decoder 210 via first bus 220. The number of information bits may be represented as a value 'k,' as shown. The encoder/decoder 210 may encode the number of information bits and output a codeword having a length 'N,' which may be different than or the same as k. The bits that are not allocated as information bits (i.e., N-k bits) may be assigned as frozen bits or parity bits. In some cases, the information bits may be assigned to the k most reliable bit channels, and the frozen bits may be assigned to the remaining bit channels. Frozen bits may be bits of a default value (e.g., 0, 1, etc.) known to both the encoder and decoder (i.e., the encoder 210 encoding information bits at a transmitter 215 and the decoder 210 decoding the codeword received at a receiver 215). Further, from the receiving device perspective, device 200 may receive encoded data via receiver 215, and decode the encoded data using decoder 210 to obtain the transmitted data.

In some wireless systems, decoder 210 may be an example of an SCL decoder. A UE 115 or base station 105 may receive a transmission including a codeword at receiver 215, and may send the transmission to the SCL decoder (e.g., decoder 210). The SCL decoder may determine input logarithmic-likelihood ratios (LLRs) for the bit channels of the received codeword. During decoding, the SCL decoder may determine decoded LLRs based on these input LLRs, where the decoded LLRs correspond to each bit channel of the polar code. These decoded LLRs may be referred to as bit metrics. In some cases, if the LLR is zero or a positive value, the SCL decoder may determine the corresponding bit is a 0 bit, and a negative LLR may correspond to a 1 bit. The SCL decoder may use the bit metrics to determine the decoded bit values.

The SCL decoder may employ multiple concurrent successive cancellation (SC) decoding processes. Each SC decoding process may decode the codeword sequentially (e.g., in order of the bit channel indices). Due to the combination of multiple SC decoding processes, the SCL decoder may calculate multiple decoding path candidates. For example, an SCL decoder of list size 'L' (i.e., the SCL decoder has L SC decoding processes) may calculate L decoding path candidates, and a corresponding reliability metric (e.g., a path metric) for each decoding path candidate. The path metric may represent a reliability of a decoding path candidate or a probability that the corresponding decoding path candidate is the correct set of decoded bits. The path metric may be based on the determined bit metrics and the bit values selected at each bit channel. The SCL decoder may have a number of levels equal to the number of bit channels in the received codeword. At each level, each decoding path candidate may select either a 0 bit or a 1 bit based on a path metric of the 0 bit and the 1 bit. The SCL decoder may select a decoding path candidate based on the path metrics, and may output the bits corresponding to the selected decoding path as the decoded sets of bits. For example, the SCL decoder may select the decoding paths with the highest path metrics.

If an SCL decoder determines that the first number of bits are all frozen bits, the SCL decoder may determine that the correct decoding path for the first number of bits must be the default frozen bit values (e.g., if the default frozen bit value is 0, the correct decoding path for the first number of bits must be all 0's). Once the SCL decoder reaches the first information bit, the SCL decoder may begin performing operations to decode the rest of the bits of the codeword, as the SCL decoder may not be able to determine the correct decoding path from the first information bit onwards (e.g., because the first information bit may be a 0 or a 1). However, the SCL decoder may still determine bit metrics for the bit channels containing frozen bits, and may use these bit metrics when calculating path metrics for the decoding path candidates. For example, the SCL decoder may update the path metric for the decoding candidates after every bit, regardless of bit type (e.g., after each frozen bit, information bit, parity bit, etc.).

In order to decode a polar coded PDCCH or PUCCH signal, device 200 may perform blind decoding. For example, receiver 215 may be configured with a set of candidate hypotheses for the PDCCH or PUCCH, where each candidate may correspond to a set of control channel elements (CCEs), N:K hypothesis (e.g., downlink/uplink control information (DCI/UCI) format), or aggregation level. Receiver 215 may identify one or more candidate codewords on the PDCCH or PUCCH, and may attempt to process each candidate codeword using different DCI/UCI formats, radio network temporary identifiers (RNTIs), or any other parameter that may affect the decoding of a PDCCH or PUCCH signal. In some cases, decoder 210 may decode the signal received by receiver 215 to obtain a set of information bits. Decoder 210 may perform a CRC or parity check on a data payload within the set of information bits, and may determine that the data payload represents a successfully decoded codeword intended for device 200. However, in some cases, the decoding operation may fail because the codeword has experienced excessive corruption (e.g., the channel has very low signal to noise ratio (SNR)), there is no transmitted codeword for the candidate hypothesis (e.g., the candidate codeword represents random noise), the transmitted codeword is intended for a different device, or the candidate hypothesis may be incorrect (e.g., incorrect codeword size, incorrect information bit size, incorrect aggregation level). In these cases, decoder 210 may detect decoding failure and attempt decoding using a different candidate codeword or candidate hypotheses. Early detection and termination (e.g., detection and termination prior to completion of SCL decoding, prior to performing a CRC or parity check on a decoded data payload of the codeword, or prior to sending decoded payload bits for processing) may reduce latency and conserve energy at device 200.

Some previous techniques for early detection and termination have included adding CRC or parity check bits throughout the codeword or pruning every decoding path candidate based on each decoding path candidate having a path metric exceed a certain pre-determined threshold. However, each of these techniques includes decoder 210 performing detection on a path-by-path basis, and suffer from increased complexity or sensitivity to SNR variation. Instead, decoder 210 may perform early detection and termination based on a comparison between multiple paths. For example, decoder 210 may perform early-termination based on a range or spread of path metrics for a set of decoding path candidates. Decoder 210 may determine that it is more likely that at least one decoding path may be successful the larger the spread metric, while it is less likely for at least one decoding path to be a correctly decoded path when the path metric values for the set of decoding path candidates are similar (e.g., having a small spread). In some cases, the actual spread of values for the path metrics may be based on the current SNR of the control channel the codeword is received on. For example, a low SNR may result in a smaller range than a high SNR. Therefore, decoder 210 may normalize the spread to minimize the effect of the SNR (e.g., while the spread may be SNR dependent, the normalized spread may be SNR independent or substantially SNR independent). Device 200 may use this normalized spread as a spread metric to determine whether to perform early-termination.

Decoder 210 may determine decoding failure based on comparing the spread metric to a spread metric threshold. For example, decoder 210 may determine that it is decoding using an incorrect decoding hypothesis, decoding without a sufficient SNR for successful decoding, or decoding random noise if the spread metric is below the spread metric threshold. In some cases, the spread metric threshold may be selected based on an early-termination probability, an error-correction performance (e.g., for a specific block length, code rate, or both), or a balance of these parameters. The spread metric threshold may also be based on the list size of decoder 210 (e.g., a larger list size may result in a larger spread of path metrics).

Decoder 210 may calculate the spread metric using a variety of techniques. In some cases, decoder 210 may use the same formula each time it calculates the spread metric. In other cases, decoder 210 may select a formula based on the determined path metrics or based on some aspect of the control channel. One possible spread metric formula selects a maximum path metric and a minimum path metric from the determined set of path metrics, and normalizes the difference of these two path metrics according to the equation:

$$\frac{\max(|PM_i|) - \min(|PM_i|)}{\min(|PM_i|)} < t \quad (1)$$

In some cases, decoder 210 may use a variation of Equation 1 (e.g., applying the normalization to the threshold for the comparison). These variations may include normalizing by the maximum path metric value rather than by the minimum path metric value, normalizing by an average path metric value, or normalizing by a median path metric value. In other cases, decoder 210 may not select the maximum and minimum path metrics for normalization. Instead, the decoder may select path metrics that correspond to certain percentiles within the set of path metrics, or based on some other selection criteria. For example, the second highest path metric and the second lowest path metric may be used to evaluate the path metric spread. Additionally, decoder 210 may use a different formula to evaluate the path metric spread than Equation 1. For example, decoder 210 may use a standard deviation formula, a variance formula, or any other formula that calculates a spread of the set of path metrics or of selected path metrics from the set of path metrics. Decoder 210 may normalize the spread metric using the above techniques. It is noted that whether higher path metrics indicate higher reliability or lower reliability, Equation 1 may be used to determine the path metric spread as it takes the difference between the maximum absolute value and the minimum absolute value of the path metrics.

In some cases, decoder 210 may use soft metrics rather than path metrics to calculate the spread metric. Decoder 210 may determine a path metric based on bit metrics for each previously decoded bit channel. In contrast, decoder 210 may determine a soft metric based on bit metrics for a subset of decoded bit channels, or based on weighting certain bit metrics more than other bit metrics. For example, decoder 210 may select a subset of bit channels to use to determine the soft metric based on generator weights or bit channel reliability (e.g., polarization weights). Decoder 210 may use one of multiple different techniques to select the bit channels for the subset of bit channels, and may apply different criteria for including information bit channels and frozen bit channels in the soft metrics. For example, in one technique, decoder 210 may determine the soft metric based on a subset of bit channels including frozen bit channels with associated generator weights above a first threshold, and information bit channels with associated generator weights below a second threshold. In some cases, decoder 210 may include or exclude a bit channel from the subset of bit channels based on an associated reliability of the bit channel (e.g., determined by polarization weight or density evolution). For example, decoder 210 may exclude frozen bits having low reliability or information bits having high reliability from the soft metrics. In some cases, to determine the soft metric, decoder 210 may adjust the bit metrics for each bit channel according to a generator weight or a bit channel reliability, and may use these weighted bit metrics to determine the soft metric.

In some cases, decoder 210 may not compare the spread metric to the spread metric threshold until after decoding a number of bit channels. The number of bit channels may be based on a number of information bit channels, a number of frozen bit channels, or a total number of bit channels. In some cases, this may reduce the chance of early-terminating when decoding an actual codeword. For example, after decoding the first information bit channel, decoder 210 may have two decoding path candidates (e.g., one where the first information bit is a 0, and one where the first information bit is a 1). At this point in the decoding process, especially if the first information bit channel is unreliable, decoder 210 may calculate a spread metric that is below the spread metric threshold, even if decoder 210 is decoding a codeword intended for device 200. Instead, decoder 210 may begin performing the spread metric calculations after a set number of bit channels (e.g., after 4 information bit channels, 6 information bit channels, 40 total bit channels, etc.), which may reduce the likelihood of early-terminating based on a single unreliable bit channel. For a decoder 210 with a larger list size (e.g., L=8), this may also allow decoder 210 to determine the full number of decoding path candidates supported before selecting path metrics or soft metrics to use to calculate the spread metric.

Additionally or alternatively, decoder 210 may compare the spread metric to the spread metric threshold following completion of the list decoding process. For example, decoder 210 may perform a final spread metric test following list decoding but prior to an error checking procedure (e.g., a CRC procedure), during the error checking procedure, or following the error checking procedure. If the spread metric does not pass the spread metric test prior to completion of the error checking procedure, the decoder may terminate the decoding process prior to completing the error checking procedure. Alternatively, if the spread metric does not pass the spread metric test following completion of the error checking procedure, the decoder 210 may terminate the decoding process and may not send the decoded bits on for further processing. In this way, the decoder 210 may reject a candidate path—and return a fail result for decoding if rejecting all candidate paths—if the candidate path does not pass both a CRC and the metric-based comparison. In some cases, by combining these techniques (e.g., CRCs and metric-based early termination), utilizing the spread metric may improve false alarm rates for a same CRC length. Accordingly, encoders 210 may implement shorter CRCs to achieve similar false alarm rates when decoders 210 implement spread metric-based early termination. Therefore, these early-termination techniques for polar list decoders may reduce overhead, conserve power, shorten codewords, improve false alarm reliability, or provide any combination of these benefits.

Figure 3:
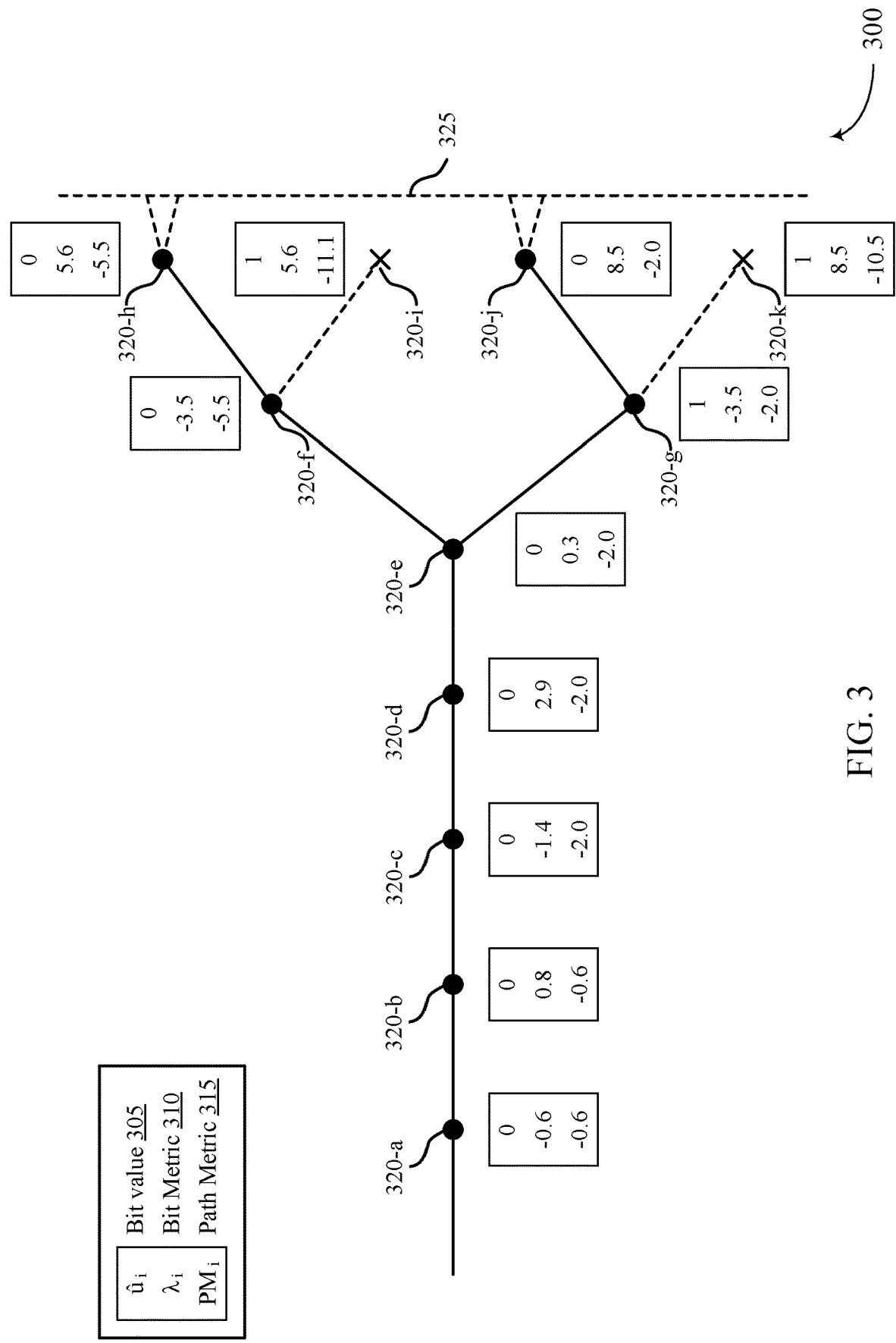
FIG. 3 illustrates an example of a decoding tree that supports early-termination techniques for polar list decoders in accordance with aspects of the present disclosure.

FIG. 3 illustrates an example of a decoding tree 300 that supports early-termination techniques for polar list decoders in accordance with various aspects of the present disclosure. Decoding tree 300 may represent a list decoding operation performed by an SCL decoder of list size L=2. Each node 320 may represent an assigned bit for a decoding path candidate. The SCL decoder may calculate a corresponding bit value 305, bit metric 310, and path metric 315 associated with each node 320, and may determine the decoding path candidates based on these calculations. In some cases, the SCL decoder may perform early-termination at 325 based on calculating a spread metric for a set of path metrics 315.

In this specific example of a decoding operation, the SCL decoder may search for an eight bit codeword (e.g., transmitted over eight bit channels). The eight bit codeword may include five frozen bits (e.g., each with a default value of 0), followed by three information bits. A receiver may receive a candidate codeword over a control channel, and may send the candidate codeword to the SCL decoder. Based on the candidate codeword, the SCL decoder may determine a received LLR for each of the eight bit channels. For example, the set of received LLRs may contain LLR values of 2.9, 0.6, −1.8, −2.3, 5.9, 7.6, −1.4, and 2.0 for bit channels 1 through 8, respectively.

The SCL decoder may perform a list decoding operation on the set of received LLRs. Based on the sequential order of decoding, the SCL decoder may first decode node 320-a, representing the first bit channel, based on the set of received LLRs. The SCL decoder may determine a decoded LLR of −0.6 for the first bit channel. The SCL decoder may use the decoded LLRs as the bit metrics 310 for calculating path metrics 315 and spread metrics during the decoding process. Therefore, the SCL decoder may set the value of the first bit metric 310 to −0.6. In some cases, a negative value of a decoded LLR may indicate a 1 bit. However, since the expected codeword contains a frozen bit in the first bit channel, the SCL decoder may assign a bit value 305 of 0 to the first bit channel.

The SCL decoder may update the path metric 315 using a monotonically decreasing process. In the monotonically decreasing process, the SCL decoder may subtract the absolute value of a bit metric 310 from the path metric 315 if the SCL decoder assigned a bit value 305 not indicated by the LLR. In this way, decreasing the path metric 315 indicates unreliability of that decoding path. In this case, the SCL decoder assigned a 0 bit to the first bit channel, despite the LLR indicating a 1 bit (e.g., because the LLR has a negative value). Therefore, the SCL decoder may subtract the absolute value of the bit metric 310 (i.e., 0.6) from an initial value of the path metric 315 (i.e., 0). As the first bit channel of the expected codeword contains a frozen bit, both decoding path candidates of the L=2 SCL decoder may assign a 0 bit to this first decoded bit channel.

The SCL decoder may continue the decoding process for the next four frozen bits, indicated by nodes 320-b, 320-c, 320-d, and 320-e. Since the expected codeword contains frozen bits in the first five bit channels, the SCL decoder may assign bit values 305 of 0 to each of these bit channels. The SCL decoder may update the path metric 315 based on each bit metric 310 that does not indicate a 0 bit (e.g., the first bit metric of −0.6 and the third bit metric of −1.4). For each bit metric 310 that indicates the assigned bit, the SCL decoder may not update the path metric 315.

For the sixth bit channel, the SCL decoder may process two decoding path candidates due to the expected codeword containing an information bit in the sixth bit channel. Node 320-f may represent a bit value 305 of 0, while node 320-g may represent a bit value 305 of 1. Since the SCL decoder has a list size of L=2, one decoding path candidate may assign a bit value 305 of 0, and the other decoding path candidate may assign a bit value 305 of 1, for the sixth bit channel. The bit metric 310 may have a value of −3.5, which may indicate a 1 bit. Therefore, the SCL decoder may decrease path metric for the decoding path candidate including node 320-f by 3.5, while the SCL decoder may not decrease the path metric for the decoding path candidate including node 320-g. At this point in the decoding process, the SCL decoder may identify the decoding path candidate including node 320-g as the most likely path corresponding to the codeword based on the current path metric 315.

In some cases, the SCL decoder may not calculate a spread metric at this point in the decoding process. For example, the SCL decoder may wait to calculate the spread metric until after a number of information bit channels. The SCL decoder may instead proceed to decoding the seventh bit channel. To decode the seventh bit, a first decoding path (e.g., the decoding path including node 320-f) may process the bit values 305 and LLRs indicated by nodes 320-h and 320-i, and may calculate the corresponding bit metrics 310 and path metrics 315. Additionally, a second decoding path (e.g., the decoding path including node 320-g) may process the bit values 305 and LLRs indicated by nodes 320-j and 320-k, and may calculate the corresponding bit metrics 310 and path metrics 315. In some cases, the SCL decoder may calculate a spread metric at this point in the decoding process, when four path metrics 315 (e.g., −5.5, −11.1, −2.0, and −10.5) are considered. In other cases, the SCL decoder may first prune paths with the lowest path metrics in order to keep the number of decoding path candidates equal to the list size. In these cases, the SCL decoder may prune the paths with path metrics 315 of −11.1 and −10.5.

The SCL decoder may calculate a spread metric based on the remaining paths. In the case of an SCL decoder of list size L=2, the SCL decoder may calculate the spread metric based on the two path metrics 315 (e.g., −5.5 and −2.0). In other cases, with a larger list size, an SCL decoder may select path metrics to use to calculate the spread metric based on a selection criteria. To calculate the spread metric, the SCL decoder may implement a normalizing function. For example, the SCL decoder may calculate a difference of the absolute values of the path metrics 315, and may normalize this value by the absolute value of one of the path metrics 315 (e.g., the minimum absolute value of path metrics 315). In this case, with path metrics of −5.5 and −2.0, the SCL decoder may calculate a spread metric of 1.75.

The SCL decoder may compare the spread metric to a spread metric threshold. In this case, the spread metric threshold may have a value of 2.0. The SCL decoder may determine to terminate the decoding process based on the spread metric (i.e., 1.75) being below the spread metric threshold (e.g., 2.0). In some cases, a low spread metric may indicate multiple channels with similar reliabilities. Accordingly, terminating the process, rather than processing a set of decoded bits with a very similar reliability to other potential bit sequences, may improve the false alarm rate of the decoder. In contrast, when successfully decoding a codeword, the SCL decoder may identify a larger spread metric (e.g., one reliable decoding path candidate having a high reliability, and the other decoding path candidates indicating lower reliability). Therefore, the low spread metric may indicate that the SCL decoder is not successfully decoding a codeword (e.g., the SCL decoder may be using an incorrect decoding hypothesis, decoding without a sufficient SNR for successful decoding, or decoding random noise). The SCL decoder may perform early-termination of the decoding process at 325 based on the comparison of the spread metric to the spread metric threshold. Although FIG. 3 describes an example where decreasing path metric values indicate less reliability, the techniques described in FIG. 3 are equally applicable to SCL decoders where increasing path metric values indicate less reliability.

Figure 4:
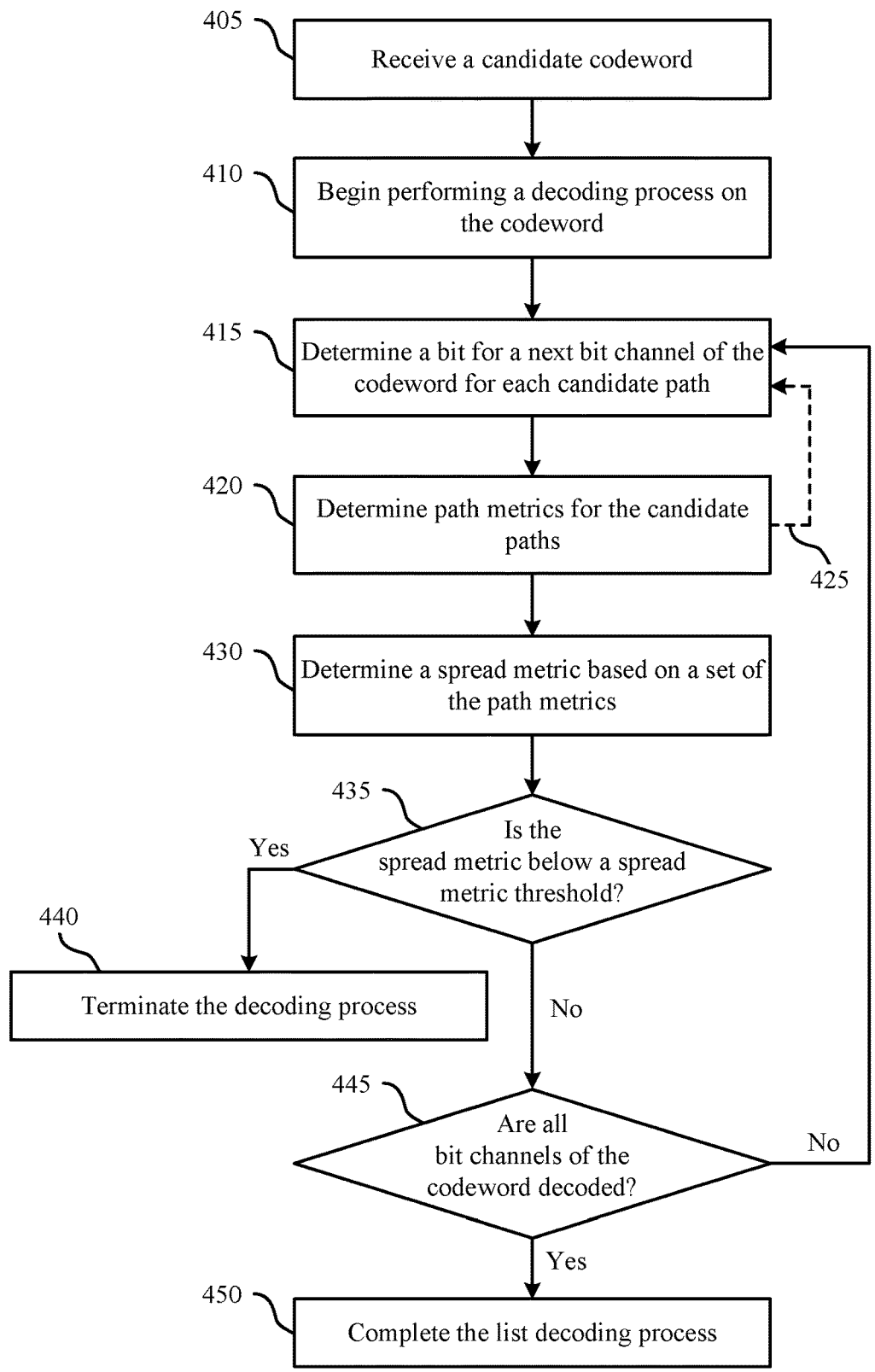
FIG. 4 illustrates an example of a process flow that supports early-termination techniques for polar list decoders in accordance with aspects of the present disclosure.

FIG. 4 illustrates an example of a process flow 400 that supports early-termination techniques for polar list decoders in accordance with various aspects of the present disclosure. Process flow 400 may be performed by wireless device, such as a UE 115 or a base station 105 as described with reference to FIG. 1.

At 405, the wireless device may receive a candidate codeword over a control channel. For example, the wireless device may identify decoding candidates for the PDCCH or the PUCCH.

At 410, the wireless device may begin performing a decoding process on the codeword. In some cases, the decoding process may be performed by an SCL decoder, where the SCL decoder may sequentially decode the codeword using a number of candidate paths (i.e., decoding paths) up to a list size of the decoder. The wireless device may decode the codeword based on certain decoding hypotheses (e.g., a hypothetical codeword size, information bit size, aggregation level, etc.). The decoding hypothesis may include a set of bit channels, where each bit channel may contain a frozen bit or an information bit. The list decoding process may include determining path metrics and a spread metric for each bit channel of at least a subset of bit channels of the decoding hypothesis.

At 415, the wireless device may decode, for each candidate path, a bit for a next bit channel. Decoding the bit may be based on performing a set of decoding operations on a set of input LLRs associated with the codeword in order to calculate a decoded LLR for that bit channel. In some cases, the wireless device may assign a bit for the bit channel for a given decoding path based on the value of the decoded LLR and the prior bit values of the decoding path. The wireless device may also calculate a bit metric associated with the decoded bit (e.g., the bit metric may be equal to the decoded LLR).

At 420, the wireless device may determine path metrics for each of a set of candidate paths. For example, if decoding using an SCL decoder, the wireless device may determine a path metric for each of the up to L candidate paths. The path metrics for a decoding path at a given bit channel may be based on the bit metric for the given bit channel and bit metrics for the preceding bit channels, which may include one or more information bit channels, one or more frozen bit channels, or a combination of the two.

At 425, the wireless device may return to 415 if the wireless device has a minimum number of bit channels to decode before performing early detection. For example, the wireless device may not perform early detection until decoding a set number of information bits, frozen bits, total bits, or some combination of these bits. In some cases, this may reduce the probability of early detection false alarms.

At 430, the wireless device may determine a spread metric based on a first path metric corresponding to a first candidate path and a second path metric corresponding to a second candidate path. In some cases, determining the spread metric may be based on a maximum path metric of a set of path metrics, a minimum path metric of the set of path metrics, an average path metric of the set of path metrics, a standard deviation of the set of path metrics, a variance of the set of path metrics, or a function involving any of these or similar variables. In some cases, determining the spread metric may include comparing the first and second path metrics (e.g., subtracting the absolute value of the minimum path metric from the absolute value of the maximum path metric) and normalizing the comparison with respect to either the first or the second path metric.

At 435, the wireless device may compare the spread metric to a spread metric threshold. In some cases, the wireless device may determine whether the spread metric is below the spread metric threshold. In some cases, the wireless device may select the spread metric threshold based on an early-termination probability associated with the codeword, an error-correction performance associated with the codeword, or a combination of the two. In some cases, 430 and 435 may be performed for each bit channel (e.g., after the set number of information bits, frozen bits or total bits), or for a subset of bit channels. In some examples, determining and comparing of the spread metric in 430 and 435 is performed using soft metrics instead of path metrics, as described above.

At 440, if the spread metric is below the spread metric threshold, the wireless device may terminate the decoding process based on the comparison of the spread metric to the spread metric threshold. This may be an example of early-termination, as the wireless device may terminate the decoding process prior to completing the sequential decoding of each bit-channel, prior to running an error check function on the candidate paths, or prior to sending a decoded bit sequence passing error checking for processing. This early-termination may be based on the wireless device determining that it is decoding a corrupted codeword, decoding random noise, or decoding based on incorrect decoding hypotheses.

At 445, if the spread metric is not below the spread metric threshold, the wireless device may determine whether all bit channels of the codeword have been decoded. If all bit channels have been decoded, the wireless device may complete the list decoding process at 450, having decoded every bit of the codeword. If there are still bit channels of the codeword remaining to be decoded, the wireless device may return to 415 to decode the next bit channel of the codeword. Upon termination of the list decoding process at 450, an error checking process may be performed on the surviving decoding paths to determine if any decoding paths pass the error checking function (e.g., CRC). If a decoding path is found to pass the error checking function, the payload information may be passed on to components of the UE 115 or base station 105 for processing. If no decoding path is found to pass the error checking function, or if a final comparison of the spread metric to the spread metric threshold (e.g., following completion of the list decoding process) does not pass, the decoder may return a fail result for the decoding process.

Figure 5:
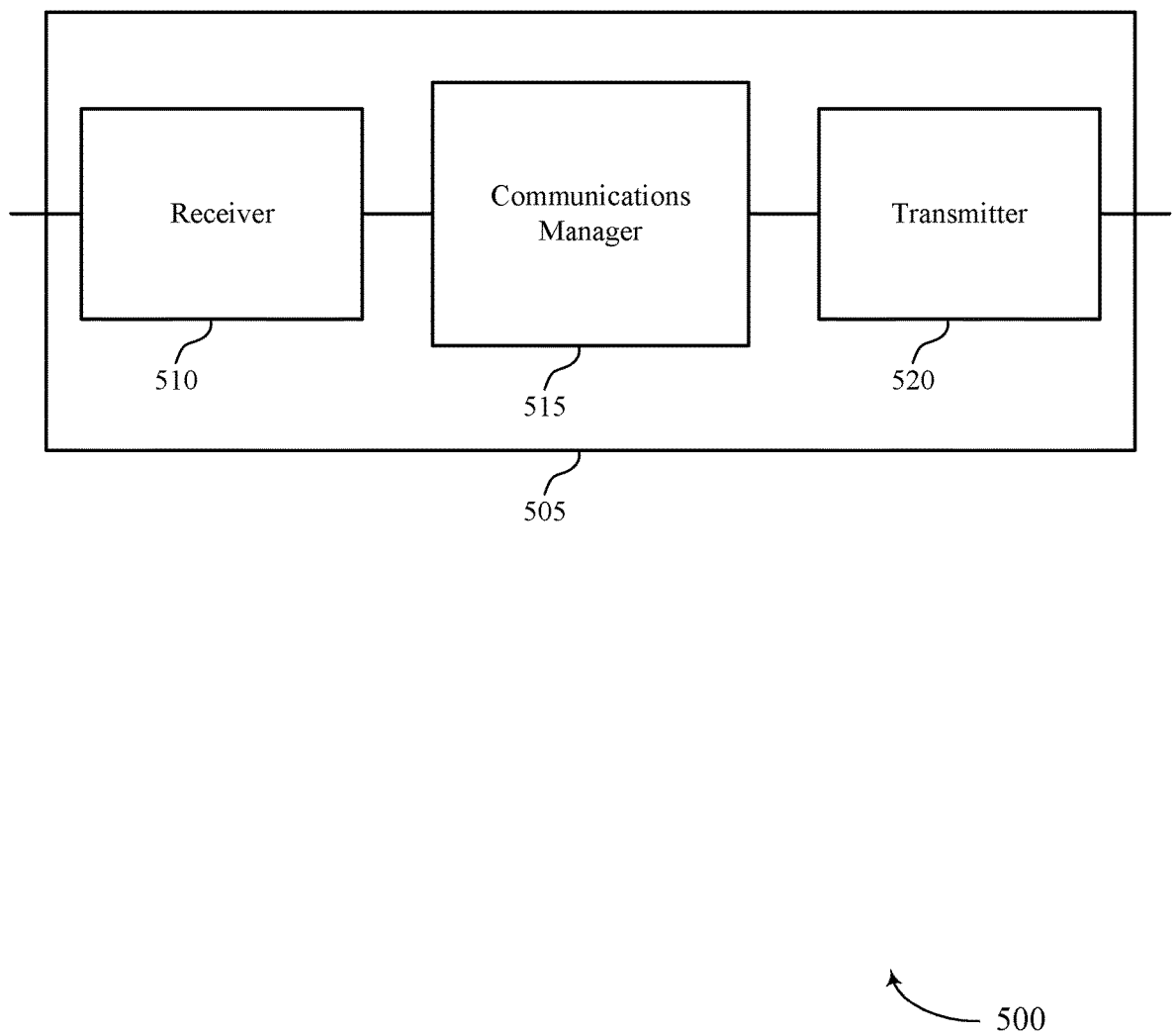
FIGS. 5 through 7 show block diagrams of a device that supports early-termination techniques for polar list decoders in accordance with aspects of the present disclosure.

FIG. 5 shows a block diagram 500 of a wireless device 505 that supports early-termination techniques for polar list decoders in accordance with aspects of the present disclosure. Wireless device 505 may be an example of aspects of a base station 105 or UE 115 as described herein. Wireless device 505 may include receiver 510, communications manager 515, and transmitter 520. Wireless device 505 may also include a processor. Each of these components may be in communication with one another (e.g., via one or more buses).

Receiver 510 may receive information such as packets, user data, or control information associated with various information channels (e.g., control channels, data channels, and information related to early-termination techniques for polar list decoders, etc.). Information may be passed on to other components of the device. The receiver 510 may be an example of aspects of the transceiver 835 described with reference to FIG. 8. The receiver 510 may utilize a single antenna or a set of antennas.

Communications manager 515 may be an example of aspects of the communications manager 815 described with reference to FIG. 8. Communications manager 515 and/or at least some of its various sub-components may be implemented in hardware, software executed by a processor, firmware, or any combination thereof. If implemented in software executed by a processor, the functions of the communications manager 515 and/or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure.

The communications manager 515 and/or at least some of its various sub-components may be physically located at various positions, including being distributed such that portions of functions are implemented at different physical locations by one or more physical devices. In some examples, communications manager 515 and/or at least some of its various sub-components may be a separate and distinct component in accordance with various aspects of the present disclosure. In other examples, communications manager 515 and/or at least some of its various sub-components may be combined with one or more other hardware components, including but not limited to an I/O component, a transceiver, a network server, another computing device, one or more other components described in the present disclosure, or a combination thereof in accordance with various aspects of the present disclosure.

Communications manager 515 may receive a candidate codeword encoded using a polar code, the candidate codeword generated based on a set of information bits, and may perform a decoding process on the candidate codeword. In some cases, the decoding process may include, for each bit channel of at least a first subset of bit channels of the polar code, determining path metrics for each of a set of decoding paths and determining a spread metric based on a first path metric corresponding to a first decoding path of the set of decoding paths and a second path metric corresponding to a second decoding path of the set of decoding paths. Communications manager 515 may terminate the decoding process based on a comparison of the spread metric to a spread metric threshold.

Transmitter 520 may transmit signals generated by other components of the device. In some examples, the transmitter 520 may be collocated with a receiver 510 in a transceiver module. For example, the transmitter 520 may be an example of aspects of the transceiver 835 described with reference to FIG. 8. The transmitter 520 may utilize a single antenna or a set of antennas.

Figure 6:
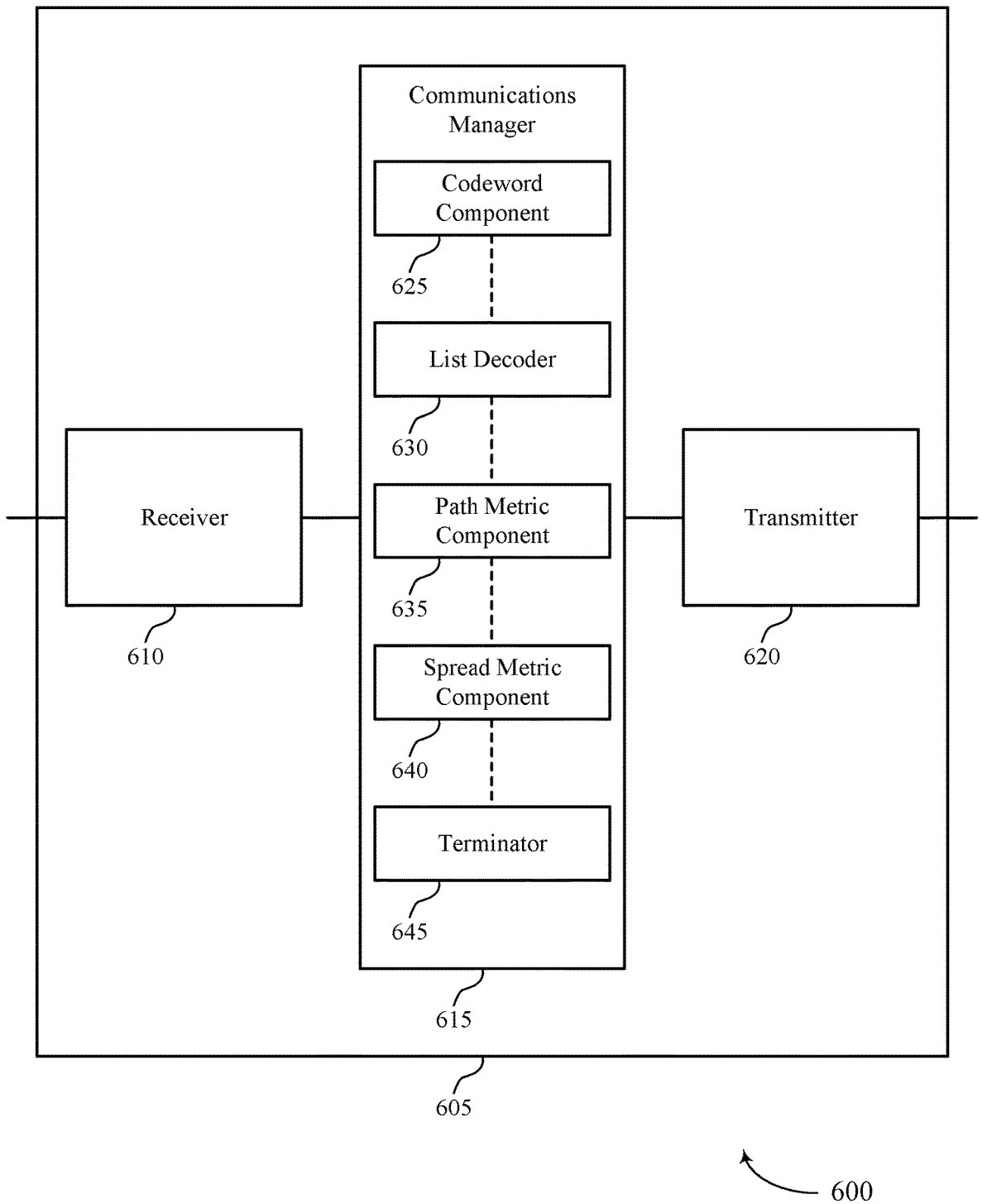

FIG. 6 shows a block diagram 600 of a wireless device 605 that supports early-termination techniques for polar list decoders in accordance with aspects of the present disclosure. Wireless device 605 may be an example of aspects of a wireless device 505 or a base station 105 or UE 115 as described with reference to FIG. 5. Wireless device 605 may include receiver 610, communications manager 615, and transmitter 620. Wireless device 605 may also include a processor. Each of these components may be in communication with one another (e.g., via one or more buses).

Receiver 610 may receive information such as packets, user data, or control information associated with various information channels (e.g., control channels, data channels, and information related to early-termination techniques for polar list decoders, etc.). Information may be passed on to other components of the device. The receiver 610 may be an example of aspects of the transceiver 835 described with reference to FIG. 8. The receiver 610 may utilize a single antenna or a set of antennas.

Communications manager 615 may be an example of aspects of the communications manager 815 described with reference to FIG. 8. Communications manager 615 may also include codeword component 625, list decoder 630, path metric component 635, spread metric component 640, and terminator 645.

Codeword component 625 may receive a candidate codeword encoded using a polar code, the candidate codeword generated based on a set of information bits. In some cases, the candidate codeword is received via a PDCCH or a PUCCH.

List decoder 630 may perform a decoding process on the candidate codeword. The decoding process may be performed for each bit channel of at least a first subset of bit channels of the polar code. In some cases, the at least the first subset of bit channels of the polar code may include bit channels subsequent to at least one bit channel corresponding to at least one of the set of information bits.

Path metric component 635 may determine path metrics for each of a set of decoding paths. In some cases, the first path metric corresponds to a maximum path metric or a minimum path metric of a set of path metrics associated with the set of decoding paths. In some examples, the second path metric corresponds to the other of the maximum path metric or the minimum path metric of the set of path metrics. In some aspects, the path metrics for the set of decoding paths are based on bit metrics for the each bit channel for the set of decoding paths and for a second subset of bit channels of the polar code preceding the each bit channel for the set of decoding paths. In some instances, the second subset of bit channels of the polar code preceding the each bit channel includes at least one information bit channel associated with one of the set of information bits and at least one frozen bit channel.

Spread metric component 640 may determine a spread metric based on a first path metric corresponding to a first decoding path of the set of decoding paths and a second path metric corresponding to a second decoding path of the set of decoding paths. In some cases, the spread metric is determined based on a function of a maximum path metric of a set of path metrics associated with the set of decoding paths, a minimum path metric of the set of path metrics or an average path metric of the set of path metrics. In some examples, the spread metric is determined based on a standard deviation of a set of path metrics associated with the set of decoding paths, a variance of the set of path metrics, or any combination thereof. In some aspects, the spread metric threshold is selected based on one or both of an early-termination probability associated with the codeword and an error-correction performance associated with the codeword.

Terminator 645 may terminate the decoding process based on a comparison of the spread metric to a spread metric threshold. In some cases, the decoding process is terminated prior to completion of a list decoding process for each bit channel of the first subset of bit channels, prior to completion of a CRC procedure, or following completion of both the list decoding process and the CRC procedure. In some examples, the termination of the list decoding process is based on the spread metric being below the spread metric threshold.

Transmitter 620 may transmit signals generated by other components of the device. In some examples, the transmitter 620 may be collocated with a receiver 610 in a transceiver module. For example, the transmitter 620 may be an example of aspects of the transceiver 835 described with reference to FIG. 8. The transmitter 620 may utilize a single antenna or a set of antennas.

Figure 7:
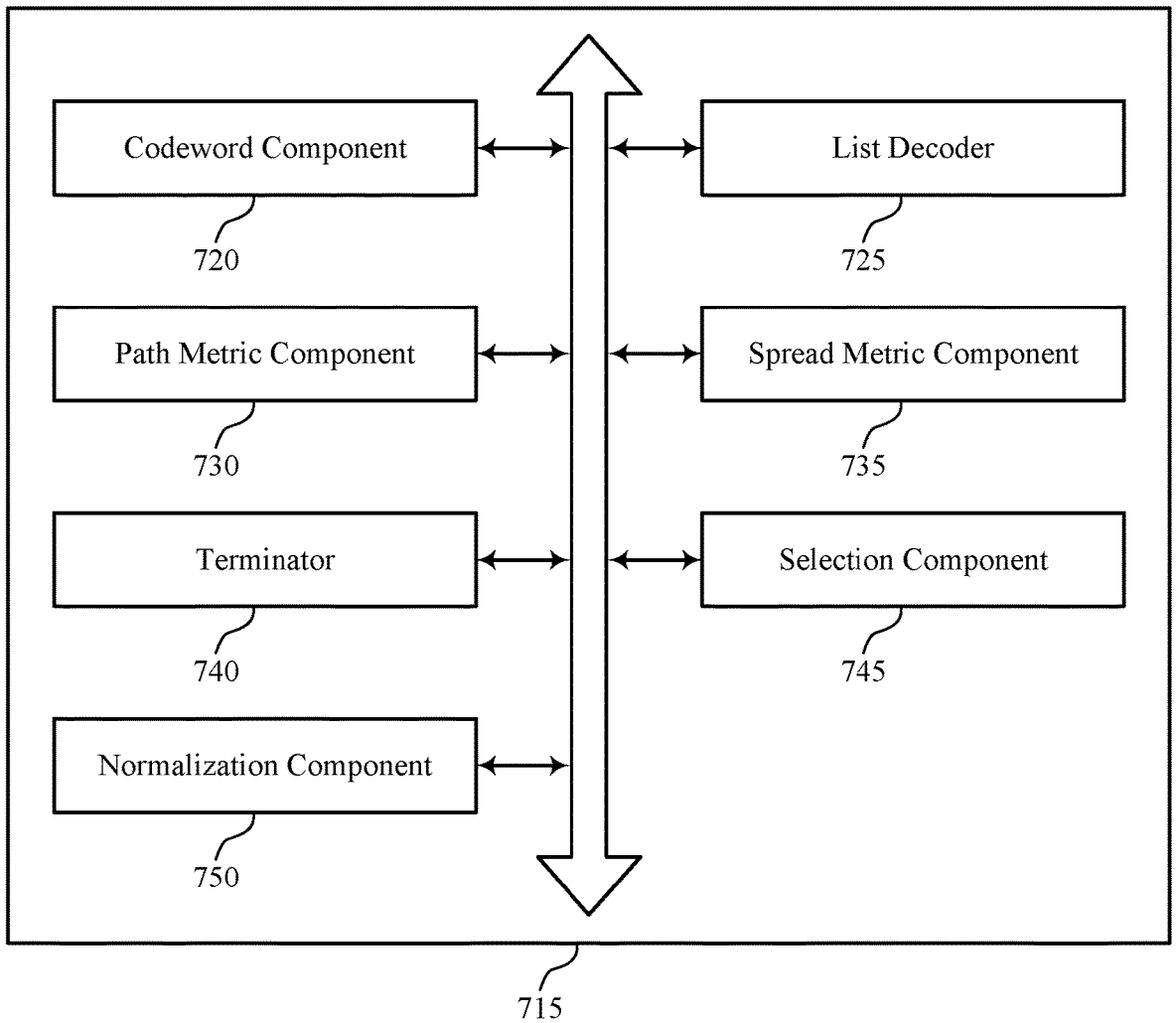

FIG. 7 shows a block diagram 700 of a communications manager 715 that supports early-termination techniques for polar list decoders in accordance with aspects of the present disclosure. The communications manager 715 may be an example of aspects of a communications manager 515, a communications manager 615, or a communications manager 815 described with reference to FIGS. 5, 6, and 8. The communications manager 715 may include codeword component 720, list decoder 725, path metric component 730, spread metric component 735, terminator 740, selection component 745, and normalization component 750. Each of these modules may communicate, directly or indirectly, with one another (e.g., via one or more buses).

Codeword component 720 may receive a candidate codeword encoded using a polar code, the candidate codeword generated based on a set of information bits. In some cases, the candidate codeword is received via a PDCCH or a PUCCH.

List decoder 725 may perform a decoding process on the codeword. In some examples, the decoding process may be performed for each bit channel of at least a first subset of bit channels of the polar code. In some cases, the at least the first subset of bit channels of the polar code include bit channels subsequent to at least one bit channel corresponding to at least one of the set of information bits.

Path metric component 730 may determine path metrics for each of a set of decoding paths. In some cases, the first path metric corresponds to a maximum path metric or a minimum path metric of a set of path metrics associated with the set of decoding paths. In some examples, the second path metric corresponds to the other of the maximum path metric or the minimum path metric of the set of path metrics. In some aspects, the path metrics for the set of decoding paths are based on bit metrics for the each bit channel for the set of decoding paths and for a second subset of bit channels of the polar code preceding the each bit channel for the set of decoding paths. In some instances, the second subset of bit channels of the polar code preceding the each bit channel includes at least one information bit channel associated with one of the set of information bits and at least one frozen bit channel.

Spread metric component 735 may determine a spread metric based on a first path metric corresponding to a first decoding path of the set of decoding paths and a second path metric corresponding to a second decoding path of the set of decoding paths. In some cases, the spread metric is determined based on a function of a maximum path metric of a set of path metrics associated with the set of decoding paths, a minimum path metric of the set of path metrics or an average path metric of the set of path metrics. In some examples, the spread metric is determined based on a standard deviation of a set of path metrics associated with the set of decoding paths, a variance of the set of path metrics, or any combination thereof. In some aspects, the spread metric threshold is selected based on one or both of an early-termination probability associated with the candidate codeword and an error-correction performance associated with the candidate codeword.

Terminator 740 may terminate the decoding process based on a comparison of the spread metric to a spread metric threshold. In some cases, the decoding process is terminated prior to completion of a list decoding process for each bit channel of the first subset of bit channels, prior to completion of a CRC procedure, or following completion of both the list decoding process and the CRC procedure. In some examples, the termination of the list decoding process is based on the spread metric being below the spread metric threshold.

Selection component 745 may select, according to a decoding order, the second subset of bit channels of the polar code preceding the each bit channel based on at least one of generator weights associated with bit channels of the polar code, polarization weights associated with bit channels of the polar code, reliability metrics associated with bit channels of the polar code, or a combination thereof.

Normalization component 750 may determine or normalize the spread metric. In some cases, determining the spread metric includes: comparing the first path metric to the second path metric and normalizing the comparison with respect to one of the first path metric or the second path metric.

Figure 8:
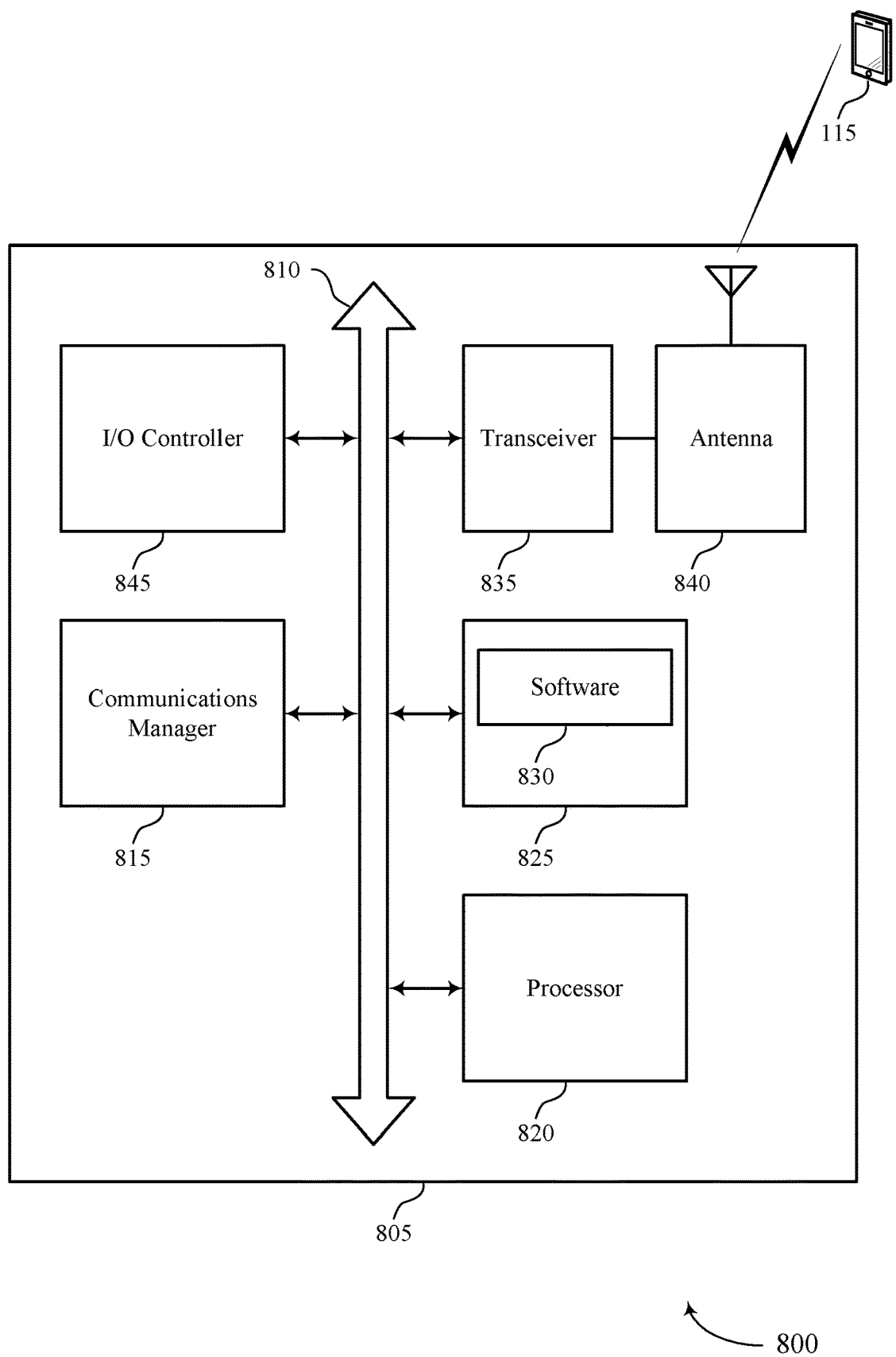
FIG. 8 illustrates a block diagram of a system including a wireless device that supports early-termination techniques for polar list decoders in accordance with aspects of the present disclosure.

FIG. 8 shows a diagram of a system 800 including a device 805 that supports early-termination techniques for polar list decoders in accordance with aspects of the present disclosure. Device 805 may be an example of or include the components of wireless device 505, wireless device 605, or a base station 105 or UE 115 as described above, e.g., with reference to FIGS. 5 and 6. Device 805 may include components for bi-directional voice and data communications including components for transmitting and receiving communications, including communications manager 815, processor 820, memory 825, software 830, transceiver 835, antenna 840, and I/O controller 845. These components may be in electronic communication via one or more buses (e.g., bus 810).

Processor 820 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 820 may be configured to operate a memory array using a memory controller. In other cases, a memory controller may be integrated into processor 820. Processor 820 may be configured to execute computer-readable instructions stored in a memory to perform various functions (e.g., functions or tasks supporting early-termination techniques for polar list decoders).

Memory 825 may include random access memory (RAM) and read only memory (ROM). The memory 825 may store computer-readable, computer-executable software 830 including instructions that, when executed, cause the processor to perform various functions described herein. In some cases, the memory 825 may contain, among other things, a basic input/output system (BIOS) which may control basic hardware or software operation such as the interaction with peripheral components or devices.

Software 830 may include code to implement aspects of the present disclosure, including code to support early-termination techniques for polar list decoders. Software 830 may be stored in a non-transitory computer-readable medium such as system memory or other memory. In some cases, the software 830 may not be directly executable by the processor but may cause a computer (e.g., when compiled and executed) to perform functions described herein.

Transceiver 835 may communicate bi-directionally, via one or more antennas, wired, or wireless links as described above. For example, the transceiver 835 may represent a wireless transceiver and may communicate bi-directionally with another wireless transceiver. The transceiver 835 may also include a modem to modulate the packets and provide the modulated packets to the antennas for transmission, and to demodulate packets received from the antennas.

In some cases, the wireless device may include a single antenna 840. However, in some cases the device may have more than one antenna 840, which may be capable of concurrently transmitting or receiving multiple wireless transmissions.

I/O controller 845 may manage input and output signals for device 805. I/O controller 845 may also manage peripherals not integrated into device 805. In some cases, I/O controller 845 may represent a physical connection or port to an external peripheral. In some cases, I/O controller 845 may utilize an operating system such as iOS®, ANDROID®, MS-DOS®, MS-WINDOWS®, OS/2®, UNIX®, LINUX®, or another known operating system. In other cases, I/O controller 845 may represent or interact with a modem, a keyboard, a mouse, a touchscreen, or a similar device. In some cases, I/O controller 845 may be implemented as part of a processor. In some cases, a user may interact with device 805 via I/O controller 845 or via hardware components controlled by I/O controller 845.

Figure 9:
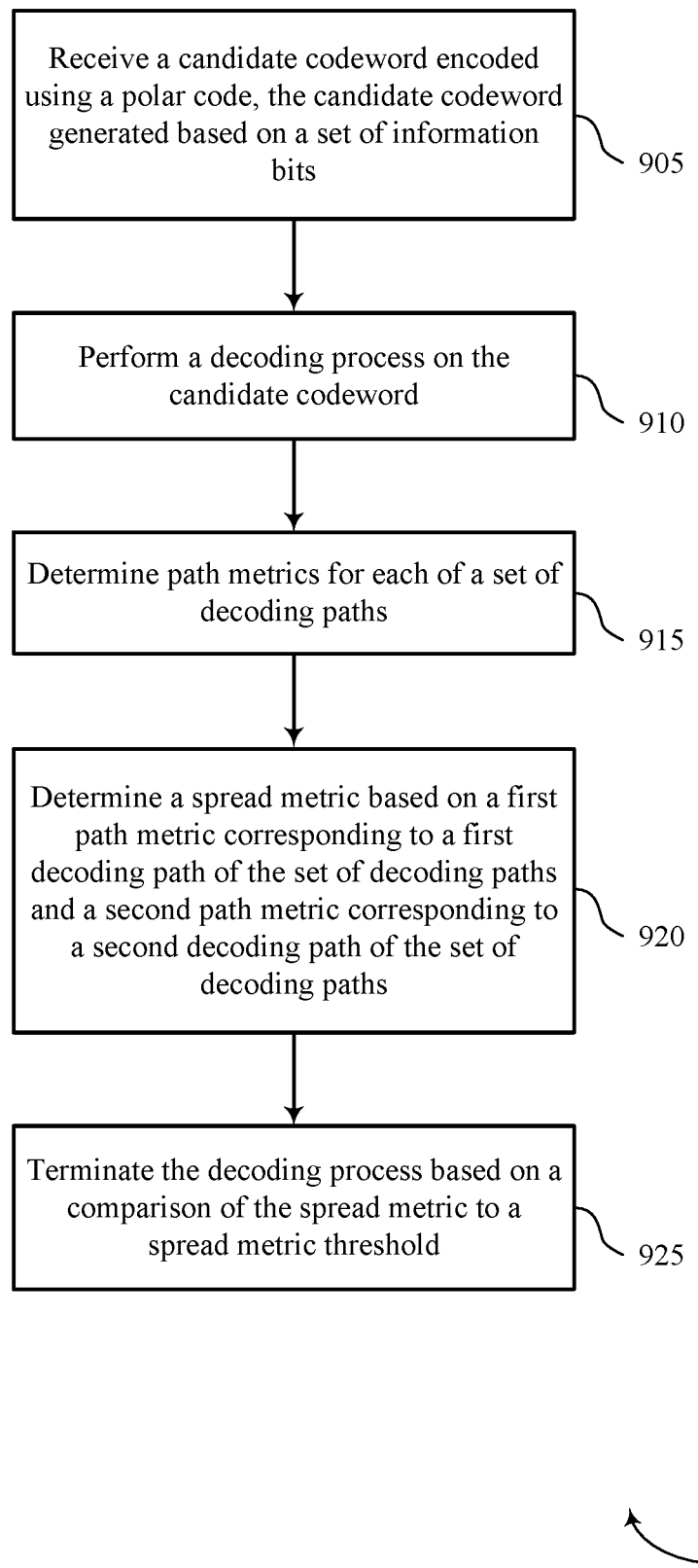
FIG. 9 illustrates a method for early-termination techniques for polar list decoders in accordance with aspects of the present disclosure.

FIG. 9 shows a flowchart illustrating a method 900 for early-termination techniques for polar list decoders in accordance with aspects of the present disclosure. The operations of method 900 may be implemented by a base station 105 or UE 115 or its components as described herein. For example, the operations of method 900 may be performed by a communications manager as described with reference to FIGS. 5 through 8. In some examples, a base station 105 or UE 115 may execute a set of codes to control the functional elements of the device to perform the functions described below. Additionally or alternatively, the base station 105 or UE 115 may perform aspects of the functions described below using special-purpose hardware.

At block 905 the base station 105 or UE 115 may receive a candidate codeword encoded using a polar code, the candidate codeword generated based at least in part on a plurality of information bits. The operations of block 905 may be performed according to the methods described herein. In certain examples, aspects of the operations of block 905 may be performed by a codeword component as described with reference to FIGS. 5 through 8.

At block 910 the base station 105 or UE 115 may perform a decoding process on the candidate codeword. In some cases, the decoding process may be performed for each bit channel of at least a first subset of bit channels of the polar code. The operations of block 910 may be performed according to the methods described herein. In certain examples, aspects of the operations of block 910 may be performed by a list decoder as described with reference to FIGS. 5 through 8.

At block 915 the base station 105 or UE 115 may determine path metrics for each of a plurality of decoding paths. The operations of block 915 may be performed according to the methods described herein. In certain examples, aspects of the operations of block 915 may be performed by a path metric component as described with reference to FIGS. 5 through 8.

At block 920 the base station 105 or UE 115 may determine a spread metric based at least in part on a first path metric corresponding to a first decoding path of the plurality of decoding paths and a second path metric corresponding to a second decoding path of the plurality of decoding paths. The operations of block 920 may be performed according to the methods described herein. In certain examples, aspects of the operations of block 920 may be performed by a spread metric component as described with reference to FIGS. 5 through 8.

At block 925 the base station 105 or UE 115 may terminate the decoding process based at least in part on a comparison of the spread metric to a spread metric threshold. The operations of block 925 may be performed according to the methods described herein. In certain examples, aspects of the operations of block 925 may be performed by a terminator as described with reference to FIGS. 5 through 8.

It should be noted that the methods described above describe possible implementations, and that the operations and the steps may be rearranged or otherwise modified and that other implementations are possible. Furthermore, aspects from two or more of the methods may be combined.

Techniques described herein may be used for various wireless communications systems such as code division multiple access (CDMA), time division multiple access (TDMA), frequency division multiple access (FDMA), orthogonal frequency division multiple access (OFDMA), single carrier frequency division multiple access (SC-FDMA), and other systems. The terms "system" and "network" are often used interchangeably. A CDMA system may implement a radio technology such as CDMA2000, Universal Terrestrial Radio Access (UTRA), etc. CDMA2000 covers IS-2000, IS-95, and IS-856 standards. IS-2000 Releases may be commonly referred to as CDMA2000 1x, 1x, etc. IS-856 (TIA-856) is commonly referred to as CDMA2000 1xEV-DO, High Rate Packet Data (HRPD), etc. UTRA includes Wideband CDMA (WCDMA) and other variants of CDMA. A TDMA system may implement a radio technology such as Global System for Mobile Communications (GSM).

An OFDMA system may implement a radio technology such as Ultra Mobile Broadband (UMB), Evolved UTRA (E-UTRA), Institute of Electrical and Electronics Engineers (IEEE) 802.11 (Wi-Fi), IEEE 802.16 (WiMAX), IEEE 802.20, Flash-OFDM, etc. UTRA and E-UTRA are part of Universal Mobile Telecommunications System (UMTS). LTE and LTE-A are releases of UMTS that use E-UTRA. UTRA, E-UTRA, UMTS, LTE, LTE-A, NR, and GSM are described in documents from the organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned above as well as other systems and radio technologies. While aspects of an LTE or an NR system may be described for purposes of example, and LTE or NR terminology may be used in much of the description, the techniques described herein are applicable beyond LTE or NR applications.

In LTE/LTE-A networks, including such networks described herein, the term eNB may be generally used to describe the base stations. The wireless communications system or systems described herein may include a heterogeneous LTE/LTE-A or NR network in which different types of eNBs provide coverage for various geographical regions. For example, each eNB, next generation NodeB (gNB), or base station may provide communication coverage for a macro cell, a small cell, or other types of cell. The term "cell" may be used to describe a base station, a carrier or component carrier associated with a base station, or a coverage area (e.g., sector, etc.) of a carrier or base station, depending on context.

Base stations may include or may be referred to by those skilled in the art as a base transceiver station, a radio base station, an access point, a radio transceiver, a NodeB, eNB, gNB, Home NodeB, a Home eNodeB, or some other suitable terminology. The geographic coverage area for a base station may be divided into sectors making up only a portion of the coverage area. The wireless communications system or systems described herein may include base stations of different types (e.g., macro or small cell base stations). The UEs described herein may be able to communicate with various types of base stations and network equipment including macro eNBs, small cell eNBs, gNBs, relay base stations, and the like. There may be overlapping geographic coverage areas for different technologies.

A macro cell generally covers a relatively large geographic area (e.g., several kilometers in radius) and may allow unrestricted access by UEs with service subscriptions with the network provider. A small cell is a lower-powered base station, as compared with a macro cell, that may operate in the same or different (e.g., licensed, unlicensed, etc.) frequency bands as macro cells. Small cells may include pico cells, femto cells, and micro cells according to various examples. A pico cell, for example, may cover a small geographic area and may allow unrestricted access by UEs with service subscriptions with the network provider. A femto cell may also cover a small geographic area (e.g., a home) and may provide restricted access by UEs having an association with the femto cell (e.g., UEs in a closed subscriber group (CSG), UEs for users in the home, and the like). An eNB for a macro cell may be referred to as a macro eNB. An eNB for a small cell may be referred to as a small cell eNB, a pico eNB, a femto eNB, or a home eNB. An eNB may support one or multiple (e.g., two, three, four, and the like) cells (e.g., component carriers).

The wireless communications system or systems described herein may support synchronous or asynchronous operation. For synchronous operation, the base stations may have similar frame timing, and transmissions from different base stations may be approximately aligned in time. For asynchronous operation, the base stations may have different frame timing, and transmissions from different base stations may not be aligned in time. The techniques described herein may be used for either synchronous or asynchronous operations.

The downlink transmissions described herein may also be called forward link transmissions while the uplink transmissions may also be called reverse link transmissions. Each communication link described herein—including, for example, wireless communications system 100 of FIG. 1—may include one or more carriers, where each carrier may be a signal made up of multiple sub-carriers (e.g., waveform signals of different frequencies).

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media may comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method for wireless communication, comprising:
receiving a candidate codeword encoded using a polar code, the candidate codeword generated based at least in part on a plurality of information bits;
performing a decoding process on the candidate codeword, the decoding process comprising, for each bit channel of at least a first subset of bit channels of the polar code:
determining path metrics for each of a plurality of decoding paths;
determining a spread metric based at least in part on a first path metric corresponding to a first decoding path of the plurality of decoding paths and a second path metric corresponding to a second decoding path of the plurality of decoding paths; and
terminating the decoding process based at least in part on a comparison of the spread metric to a spread metric threshold.

2. The method of claim 1, wherein:
the decoding process is terminated prior to completion of a list decoding process for the each bit channel of the first subset of bit channels.

3. The method of claim 1, wherein:
the decoding process is terminated prior to completion of an error checking procedure on the plurality of decoding paths.

4. The method of claim 1, wherein:
the decoding process is terminated following completion of both a list decoding process for the each bit channel of the first subset of bit channels and an error checking procedure on the plurality of decoding paths.

5. The method of claim 1, wherein:
the first path metric corresponds to a maximum path metric or a minimum path metric of a set of path metrics associated with the plurality of decoding paths; and
the second path metric corresponds to the other of the maximum path metric or the minimum path metric of the set of path metrics.

6. The method of claim 1, wherein:
the at least the first subset of bit channels of the polar code comprise bit channels subsequent to at least one bit channel corresponding to at least one of the plurality of information bits.

7. The method of claim 1, wherein:
the path metrics for the plurality of decoding paths are based on bit metrics for the each bit channel for the plurality of decoding paths and for a second subset of bit channels of the polar code preceding the each bit channel for the plurality of decoding paths.

8. The method of claim 7, further comprising:
selecting, according to a decoding order, the second subset of bit channels of the polar code preceding the each bit channel based at least in part on at least one of generator weights associated with bit channels of the polar code, reliability metrics associated with the bit channels of the polar code, or a combination thereof.

9. The method of claim 7, wherein:
the second subset of bit channels of the polar code preceding the each bit channel comprises at least one information bit channel associated with one of the plurality of information bits and at least one frozen bit channel.

10. The method of claim 1, wherein:
the spread metric is determined based at least in part on a function of a maximum path metric of a set of path metrics associated with the plurality of decoding paths, a minimum path metric of the set of path metrics or an average path metric of the set of path metrics.

11. The method of claim 1, wherein:
the spread metric is determined based at least in part on a standard deviation of a set of path metrics associated with the plurality of decoding paths, a variance of the set of path metrics, or any combination thereof.

12. The method of claim 1, wherein determining the spread metric comprises:
comparing the first path metric to the second path metric and normalizing the comparison with respect to one of the first path metric or the second path metric.

13. The method of claim 1, wherein:
the decoding process is terminated based at least in part on the spread metric being below the spread metric threshold.

14. The method of claim 1, wherein:
the spread metric threshold is selected based at least in part on one or both of an early-termination probability associated with the candidate codeword and an error-correction performance associated with the candidate codeword.

15. The method of claim 1, wherein:
the candidate codeword is received via a physical downlink control channel (PDCCH) or a physical uplink control channel (PUCCH).

16. An apparatus for wireless communication, comprising:
means for receiving a candidate codeword encoded using a polar code, the candidate codeword generated based at least in part on a plurality of information bits;
means for performing a decoding process on the candidate codeword, the means for performing the decoding process comprising, for each bit channel of at least a first subset of bit channels of the polar code:
means for determining path metrics for each of a plurality of decoding paths;
means for determining a spread metric based at least in part on a first path metric corresponding to a first decoding path of the plurality of decoding paths and a second path metric corresponding to a second decoding path of the plurality of decoding paths; and
means for terminating the decoding process based at least in part on a comparison of the spread metric to a spread metric threshold.

17. The apparatus of claim 16, wherein:
the decoding process is terminated prior to completion of a list decoding process for the each bit channel of the first subset of bit channels.

18. The apparatus of claim 16, wherein:
the decoding process is terminated prior to completion of an error checking procedure on the plurality of decoding paths.

19. The apparatus of claim 16, wherein:
the decoding process is terminated following completion of both a list decoding process for the each bit channel of the first subset of bit channels and an error checking procedure on the plurality of decoding paths.

20. The apparatus of claim 16, wherein:
the first path metric corresponds to a maximum path metric or a minimum path metric of a set of path metrics associated with the plurality of decoding paths; and
the second path metric corresponds to the other of the maximum path metric or the minimum path metric of the set of path metrics.

21. The apparatus of claim 16, wherein:
the at least the first subset of bit channels of the polar code comprise bit channels subsequent to at least one bit channel corresponding to at least one of the plurality of information bits.

22. The apparatus of claim 16, wherein:
the path metrics for the plurality of decoding paths are based on bit metrics for the each bit channel for the plurality of decoding paths and for a second subset of bit channels of the polar code preceding the each bit channel for the plurality of decoding paths.

23. The apparatus of claim 22, further comprising:
means for selecting, according to a decoding order, the second subset of bit channels of the polar code preceding the each bit channel based at least in part on at least one of generator weights associated with bit channels of the polar code, reliability metrics associated with the bit channels of the polar code, or a combination thereof.

24. The apparatus of claim 22, wherein:
the second subset of bit channels of the polar code preceding the each bit channel comprises at least one information bit channel associated with one of the plurality of information bits and at least one frozen bit channel.

25. The apparatus of claim 16, wherein:
the spread metric is determined based at least in part on a function of a maximum path metric of a set of path metrics associated with the plurality of decoding paths, a minimum path metric of the set of path metrics or an average path metric of the set of path metrics.

26. The apparatus of claim 16, wherein:
the spread metric is determined based at least in part on a standard deviation of a set of path metrics associated with the plurality of decoding paths, a variance of the set of path metrics, or any combination thereof.

27. The apparatus of claim 16, wherein the means for determining the spread metric comprises:
means for comparing the first path metric to the second path metric and normalizing the comparison with respect to one of the first path metric or the second path metric.

28. The apparatus of claim 16, wherein:
the decoding process is terminated based at least in part on the spread metric being below the spread metric threshold.

29. The apparatus of claim 16, wherein:
the spread metric threshold is selected based at least in part on one or both of an early-termination probability associated with the candidate codeword and an error-correction performance associated with the candidate codeword.

30. The apparatus of claim 16, wherein:
the candidate codeword is received via a physical downlink control channel (PDCCH) or a physical uplink control channel (PUCCH).

31. An apparatus for wireless communication, comprising:
a processor;
memory in electronic communication with the processor; and
instructions stored in the memory and operable, when executed by the processor, to cause the apparatus to:
receive a candidate codeword encoded using a polar code, the candidate codeword generated based at least in part on a plurality of information bits;
perform a decoding process on the candidate codeword, the decoding process comprising, for each bit channel of at least a first subset of bit channels of the polar code:
determine path metrics for each of a plurality of decoding paths;
determine a spread metric based at least in part on a first path metric corresponding to a first decoding path of the plurality of decoding paths and a second path metric corresponding to a second decoding path of the plurality of decoding paths; and
terminate the decoding process based at least in part on a comparison of the spread metric to a spread metric threshold.

32. The apparatus of claim 31, wherein:
the decoding process is terminated prior to completion of a list decoding process for the each bit channel of the first subset of bit channels.

33. The apparatus of claim 31, wherein:
the decoding process is terminated prior to completion of an error checking procedure on the plurality of decoding paths.

34. The apparatus of claim 31, wherein:
the decoding process is terminated following completion of both a list decoding process for the each bit channel of the first subset of bit channels and an error checking procedure on the plurality of decoding paths.

35. The apparatus of claim 31, wherein:
the first path metric corresponds to a maximum path metric or a minimum path metric of a set of path metrics associated with the plurality of decoding paths; and
the second path metric corresponds to the other of the maximum path metric or the minimum path metric of the set of path metrics.

36. The apparatus of claim 31, wherein:
the at least the first subset of bit channels of the polar code comprise bit channels subsequent to at least one bit channel corresponding to at least one of the plurality of information bits.

37. The apparatus of claim 31, wherein:
the path metrics for the plurality of decoding paths are based on bit metrics for the each bit channel for the plurality of decoding paths and for a second subset of bit channels of the polar code preceding the each bit channel for the plurality of decoding paths.

38. The apparatus of claim 37, wherein the instructions are further executable by the processor to:
select, according to a decoding order, the second subset of bit channels of the polar code preceding the each bit channel based at least in part on at least one of generator weights associated with bit channels of the polar code, reliability metrics associated with the bit channels of the polar code, or a combination thereof.

39. The apparatus of claim 37, wherein:
the second subset of bit channels of the polar code preceding the each bit channel comprises at least one information bit channel associated with one of the plurality of information bits and at least one frozen bit channel.

40. The apparatus of claim 31, wherein:
the spread metric is determined based at least in part on a function of a maximum path metric of a set of path metrics associated with the plurality of decoding paths, a minimum path metric of the set of path metrics or an average path metric of the set of path metrics.

41. The apparatus of claim 31, wherein:
the spread metric is determined based at least in part on a standard deviation of a set of path metrics associated with the plurality of decoding paths, a variance of the set of path metrics, or any combination thereof.

42. The apparatus of claim 31, wherein the instructions are further executable by the processor to:
compare the first path metric to the second path metric and normalizing the comparison with respect to one of the first path metric or the second path metric.

43. The apparatus of claim 31, wherein:
the decoding process is terminated based at least in part on the spread metric being below the spread metric threshold.

44. The apparatus of claim 31, wherein:
the spread metric threshold is selected based at least in part on one or both of an early-termination probability associated with the candidate codeword and an error-correction performance associated with the candidate codeword.

45. The apparatus of claim 31, wherein:
the candidate codeword is received via a physical downlink control channel (PDCCH) or a physical uplink control channel (PUCCH).

46. A non-transitory computer-readable medium storing code for wireless communication, the code comprising instructions executable by a processor to:
receive a candidate codeword encoded using a polar code, the candidate codeword generated based at least in part on a plurality of information bits;
perform a decoding process on the candidate codeword, the instructions executable by the processor to perform the decoding process comprising, for each bit channel of at least a first subset of bit channels of the polar code, further instructions executable by the processor to:
determine path metrics for each of a plurality of decoding paths;
determine a spread metric based at least in part on a first path metric corresponding to a first decoding path of the plurality of decoding paths and a second path metric corresponding to a second decoding path of the plurality of decoding paths; and
terminate the decoding process based at least in part on a comparison of the spread metric to a spread metric threshold.

* * * * *